(12) United States Patent
Nakayama et al.

(10) Patent No.: US 7,511,296 B2
(45) Date of Patent: Mar. 31, 2009

(54) ORGANIC SEMICONDUCTOR DEVICE, FIELD-EFFECT TRANSISTOR, AND THEIR MANUFACTURING METHODS

(75) Inventors: Tomonari Nakayama, Yokohama (JP); Toshinobu Ohnishi, Yokohama (JP); Daisuke Miura, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 309 days.

(21) Appl. No.: 11/373,966

(22) Filed: Mar. 14, 2006

(65) Prior Publication Data

US 2006/0214159 A1 Sep. 28, 2006

(30) Foreign Application Priority Data

Mar. 25, 2005 (JP) ............................. 2005-088938

(51) Int. Cl.
*H01L 35/24* (2006.01)

(52) U.S. Cl. .................... 257/40; 257/642; 257/759

(58) Field of Classification Search ............ 257/40, 257/642, 759
See application file for complete search history.

(56) References Cited

U.S. PATENT DOCUMENTS

| | | | | |
|---|---|---|---|---|
| 6,107,117 | A | 8/2000 | Bao et al. ................. 438/99 |
| 7,094,625 | B2 | 8/2006 | Miura et al. ................ 438/99 |
| 7,140,321 | B2 | 11/2006 | Nakayama et al. ......... 118/723 |
| 2004/0094761 | A1 | 5/2004 | Sparrowe et al. ............ 257/40 |
| 2005/0202348 | A1* | 9/2005 | Nakayama et al. .......... 430/311 |
| 2006/0081880 | A1 | 4/2006 | Miyazaki et al. ........... 257/200 |
| 2006/0113523 | A1 | 6/2006 | Kubota et al. ................ 257/40 |
| 2006/0145141 | A1 | 7/2006 | Miura et al. ................. 257/40 |
| 2007/0012914 | A1 | 1/2007 | Miura et al. ................. 257/40 |
| 2007/0051947 | A1 | 3/2007 | Nakayama et al. ........... 257/40 |
| 2007/0085072 | A1 | 4/2007 | Masumoto et al. ........... 257/40 |

FOREIGN PATENT DOCUMENTS

| | | |
|---|---|---|
| JP | 10-190001 | 7/1998 |
| JP | 2004-128469 | 4/2004 |
| WO | 02-09190 | 1/2002 |

OTHER PUBLICATIONS

A. Assadi, et al., "Field-effect mobility of poly(3-hexylthiophene)", Appl. Phys. Lett., vol. 53, No. 3, Jul. 18, 1988, pp. 195-197.

H. Fuchigami, et al., "Polythienylenevinylene thin-film transistor with high carrier mobility", Appl. Phys. Lett., vol. 63, No. 10, Sep. 6, 1993, pp. 1372-1374.

(Continued)

*Primary Examiner*—Matthew E Warren
(74) *Attorney, Agent, or Firm*—Fitzpatrick, Cella, Harper & Scinto

(57) ABSTRACT

An organic semiconductor device is provided which includes an organic semiconductor layer and an insulating layer. The insulating layer is made of a cured material formed from a composition containing a resin and a crosslinking agent. The resin contains an organic resin having a hydroxyl group. The crosslinking agent contains a compound having at least two crosslinking groups. At least one of the crosslinking groups is a methylol group or an NH group. The composition contains the crosslinking agent in the range of 15 to 45 percent by weight relative to 100 parts by weight in total of the resin and the crosslinking agent.

14 Claims, 3 Drawing Sheets

OTHER PUBLICATIONS

Esther Levy, "15 Years of Advanced Materials: Past and Future", Advanced Materials, vol. 15, No. 1, Jan. 3, 2003, pp. 13-18.

Tatsuya Shimoda, et al., "Organic transistor fabricated by ink-jet printing", Oyo Buturi, vol. 70, No. 12, 2001, pp. 1452-1456. (with partial translation)

Janos Veres, et al., "Low-$k$ Insulators as the Choice of Dielectrics in Organic Field-Effect Transistors", Advanced Functional Materials, vol. 13, No. 3, Mar. 2003, pp. 199-204.

Ute Zschieschang, et al., "Flexible Organic Circuits with Printed Gate Electrodes", Advanced Materials, vol. 15., No. 14, Jul. 17, 2003, pp. 1147-1151.

* cited by examiner

ORGANIC SEMICONDUCTOR DEVICE, FIELD-EFFECT TRANSISTOR, AND THEIR MANUFACTURING METHODS

BACKGROUND OF THE INVENTION

1. Field of the Invention

The present invention relates to organic semiconductor devices, field-effect transistors (FETs), and their manufacturing methods. In particular, the invention relates to a field-effect transistor including a gate insulating layer which can be easily formed from a solution and from which low-molecular-weight impurities or the like do not precipitate, and a method for manufacturing the same. The field-effect transistor can exhibit a high mobility even if the substrate is made of a resin.

2. Description of the Related Art

IC technology using organic semiconductor devices has recently received attention because they can be prepared at low cost and allow the use of a flexible resin substrate. Because of these advantages, the organic semiconductor devices promise to be applied to, for example, circuits using plastic boards, display drive circuits for electronic tags and displays, and memory.

An organic semiconductor device generally includes a substrate, insulating layers, electrodes, and an organic semiconductor layer. Among such organic semiconductor devices is a thin-film field-effect transistor including a gate insulating layer, a gate electrode, a source electrode, a drain electrode, and an organic semiconductor layer.

In a field-effect transistor using an organic semiconductor as the semiconductor layer, when the voltage (gate voltage, Vg) applied to the gate electrode is varied, the electric charge (carrier) at the interface between the gate insulating layer and the organic semiconductor layer increases or decreases. As a result, the value of drain-source current (Id, negative when flows from the drain electrode to the source electrode) flowing from the source electrode to the drain electrode through the organic semiconductor is varied. Thus, the field-effect transistor functions. The field-effect transistor functioning as the most ideal switching device can switch the states where carrier path is present and absent.

In fact, high-performance organic semiconductor devices are produced by applying a solution of an organic semiconductor compound, such as polyalkylthiophene or poly(thienylenevinylene) (see Assadi A. et al., "Field-effect mobility of poly(3-hexylthiophene)", Appl. Phys. Lett., vol. 53, p. 195 (1988); Fuchigami H. et al., "Polythienylenevinylene thin-film transistor with high carrier mobility", Appl. Phys. Lett., vol. 63, p. 1372 (1993); and Japanese Patent Laid-Open No. 10-190001).

In order to produce an inexpensive and flexible device, the electrodes and the insulating layers can be formed on a flexible resin substrate by coating or printing. However, the smoothness and flatness of the resin substrate is extremely inferior to those of silicon or glass substrates. Also, wet processes, such as printing, are easily affected by the surface state of the substrate. It is therefore difficult to form an insulating gate insulating layer with a uniform thickness and sufficient insulation properties on the resin substrate. Accordingly, the leak current from the source electrode to the drain electrode increases disadvantageously.

For the production of the organic semiconductor device on a flexible resin substrate, the components overlying the substrate, such as the gate insulating layer and the organic semiconductor layer, are preferably formed at low temperatures of 200° C. or less. The resin substrate may be softened and degraded in an atmosphere of high temperature.

Known insulating layers will be illustrate below.

For example, Simoda et al. have produced an field-effect transistor including an insulating layer formed of polyvinylphenol (PVP), and electrodes and an organic semiconductor layer formed by ink jet printing (Simoda T. et al., "Organic transistor fabricated by ink-jet printing" Oyo-buturi, Vol. 70, p. 1452 (2001). Veres et al. have produced a field-effect transistor including a polytriallylamine organic semiconductor layer on an insulating layer having a low relative dielectric constant (Veres B. J. et al., "Low-k insulator as the choice of dielectrics in organic field-effect transistors", vol. 13, p. 199 (2003)). Both the studies above use thermoplastic resins for the insulating layers. The thermoplastic resin insulating layers exhibit high workability, but have problems with solvent resistance and thermal stability. Thus, the thermoplastic resin insulating layer is unsuitable for use in a multilayer structure, and it is difficult to form a highly insulating thin, dense layer.

Other approaches have been reported in which the insulating layer is formed of a thermosetting resin prepared by adding a methylated or acylated melamine-formaldehyde resin to PVP (Japanese Patent Laid-Open No. 2004-128469; Zschieschang, et al., "Flexible Organic Circuits with Printed Gate Electrodes", Advanced Materials, vol. 15, p. 1147 (2003)). This type of insulating layers may allow unreacted polar groups to remain in the layer after baking the resin at low temperatures at 200° C. or less, and the insulation properties may be reduced due to hygroscopicity or the like.

In addition, US2004094761 A1 and WO2002/009190 have disclosed improved insulating layers.

Each insulating layer above cannot ensure a high insulation or reliability if it is baked at a low temperature at which the plastic substrate can be maintained. If a catalyst or the like is added so that the insulating layer can be cured at a low temperature, the catalyst may undesirably contaminate the organic semiconductor layer. Thus, it has been difficult to achieve a field-effect transistor including an organic semiconductor layer with a high mobility and reliability.

As described above, it has been difficult to form a highly insulating uniform organic layer on a resin substrate in inexpensive manufacturing processes of field-effect transistors using organic semiconductors. Although thermally curable resin compositions prepared by adding a crosslinking agent to a thermoplastic resin, which is easy to apply for film formation, are useful to solve the difficulty, the thermally curable resin compositions cannot be sufficiently cured to form an insulating layer in the absence of a catalyst. Thus, it is difficult to form a highly insulating layer not adversely affecting the organic semiconductor layer. This is a challenge in the formation of not only the gate insulating layer, but also other insulating layers, and is also a challenge to field-effect transistors and other devices using organic semiconductors.

SUMMARY OF THE INVENTION

The inventors of the present invention has found that an insulating layer made of a thermally cured material formed from a curable resin composition containing a resin having a specific substituent and a crosslinking agent having a specific crosslinking group is suitable for organic semiconductor devices. In particular, the use of the insulating layer as a gate insulating layer can achieve a field-effect transistor in which current leakage from the gate electrode to the source or drain electrode is extremely reduced.

According to an aspect of the present invention, there is provided an organic semiconductor device including at least an organic semiconductor layer and an insulating layer. The insulating layer is made of a cured material formed from a composition containing a resin and a crosslinking agent. The resin contains an organic resin having a hydroxyl group. The crosslinking agent has at least two crosslinking groups. At least one of the crosslinking groups is a methylol group or an NH group. The composition contains the crosslinking agent in the range of 15 to 45 percent by weight relative to 100 parts by weight in total of the resin and the crosslinking agent. In other words, relative to 100 parts by weight in total of the resin and the crosslinking agent, 15 to 45 parts by weight of the crosslinking agent is added.

In another aspect, the invention is directed to a field-effect transistor including at least an organic semiconductor layer and an insulating layer. The insulating layer is made of a cured material formed from a composition containing a resin and a crosslinking agent. The resin contains an organic resin having a hydroxyl group. The crosslinking agent has at least two crosslinking groups. At least one of the crosslinking groups is a methylol group or an NH group. The composition contains the crosslinking agent in the range of 15 to 45 percent by weight relative to 100 parts by weight in total of the resin and the crosslinking agent. In other words, 15 to 45 parts by weight of the crosslinking agent is added.

In the field-effect transistor, the insulating layer can be a gate insulating layer.

In the organic semiconductor device and the field-effect transistor, the crosslinking agent can contain at least one compound selected from among the compounds expressed by the following general formulas:

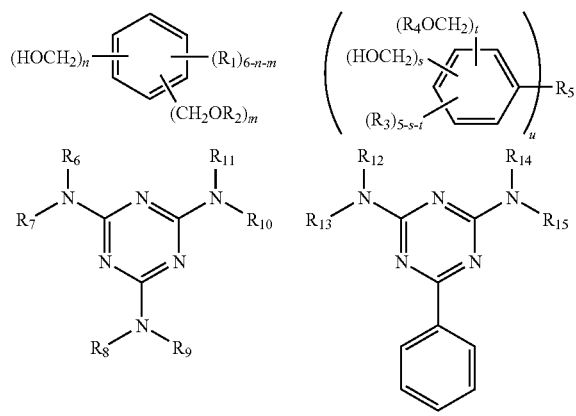

In the formulas, $R_1$ and $R_3$ each represent at least one selected from the group consisting of hydrogen, halogen, hydroxyl, thiol, amino, nitro, cyano, carboxyl, amido, and aryl, and alkyl, alkenyl, alkynyl, alkoxyl, alkylthio, hydroxyalkyl and acyl having carbon numbers in the range of 1 to 12. $R_2$ and $R_4$ each represent at least one selected from the group consisting of alkoxymethyl and acyloxymethyl having carbon numbers in the range of 1 to 6. $R_5$ represents a u-valent organic group and u represents an integer in the range of 1 to 5. n represents an integer in the range of 1 to 6, m represents an integer in the range of 0 to 5, and $2 \leq n+m \leq 6$ holes. s Represents an integer in the range of 1 to 5, t represents an integer in the range of 0 to 4, and $2 \leq s+t \leq 5$ holes. The $R_3$'s of the groups bound to the $R_5$ may be the same or different, and the $R_4$'s may also be the same or different.

$R_6$, $R_7$, $R_8$, $R_9$, $R_{10}$, and $R_{11}$ each represent at least one selected from the group consisting of —$CH_2OH$, —H, and —$CH_2OR_{16}$, and alkyl, alkenyl, alkynyl, alkoxyl, alkylthio, hydroxyalkyl and acyl having carbon numbers in the range of 1 to 12. At least one of the $R_6$, $R_7$, $R_8$, $R_9$, $R_{10}$, and $R_{11}$ is —$CH_2OH$ or —H and at least two of the $R_6$, $R_7$, $R_8$, $R_9$, $R_{10}$, and $R_{11}$ are —$CH_2OH$, —H, or —$CH_2OR_{16}$. $R_{12}$, $R_{13}$, $R_{14}$, and $R_{15}$ each represent at least one selected from the group consisting of —$CH_2OH$, —H, and —$CH_2OR_{18}$, and alkyl, alkenyl, alkynyl, alkoxyl, alkylthio, hydroxyalkyl and acyl having carbon numbers in the range of 1 to 12. At least one of the $R_{12}$, $R_{13}$, $R_{14}$, and $R_{15}$ is —$CH_2OH$ or —H and at least two of the $R_{12}$, $R_{13}$, $R_{14}$, and $R_{15}$ are —$CH_2OH$, —H, or —$CH_2OR_{18}$. $R_{16}$ and $R_{18}$ each represent at least one selected from the group consisting of alkoxymethyl and acyloxymethyl having carbon numbers in the range of 1 to 6. The $R_{16}$'s may be the same or different and the $R_{18}$'s may be the same or different.

In the organic semiconductor device and the field-effect transistor, the hydroxyl group of the resin can be a phenolic hydroxyl group.

The resin having the phenolic hydroxyl group can be a phenol resin and/or a polyvinylphenol resin.

The insulating layer can have a volume resistivity of about $1 \times 10^{13}$ Ω·cm or more.

The organic semiconductor layer of the field-effect transistor can contain a porphyrin compound.

The organic semiconductor device and field-effect transistor can further include a substrate that is at least partially made of a resin.

In still another aspect, the invention is directed to a method for manufacturing an organic semiconductor device including at least an organic semiconductor layer and an insulating layer. The method includes the step of forming the insulating layer by applying a curable resin composition containing a resin and a crosslinking agent, and then heating the curable resin composition. The resin contains an organic resin having a hydroxyl group, and the crosslinking agent has at least two crosslinking groups. At least one of the crosslinking groups is a methylol group or an NH group. Relative to 100 parts by weight in total of the resin and the crosslinking agent, 15 to 45 parts by weight of the crosslinking agent is added.

The invention is also directed to a method for manufacturing a field-effect transistor including at least an organic semiconductor layer and an insulating layer. The method includes the step of forming the insulating layer by applying a curable resin composition containing a resin and a crosslinking agent, and then heating the curable resin composition. The resin contains an organic resin having a hydroxyl group, and the crosslinking agent has at least two crosslinking groups. At least one of the crosslinking groups is a methylol group or an NH group. Relative to 100 parts by weight in total of the resin and the crosslinking agent, 15 to 45 parts by weight of the crosslinking agent is added.

The crosslinking agent used in the method for manufacturing the organic semiconductor device or the field-effect transistor can contain at least one compound selected from among the compounds expressed by the general formulas shown above.

The curable resin composition can be heated at a temperature in the range of 120 to 220° C.

The crosslinking agent used herein refers to a compound having crosslinking groups, each reacting with the hydroxyl group of the resin, optionally in the presence of a catalyst, to form a bond. The crosslinking groups include a group that can react with the hydroxyl group of the resin after removing a protecting group (for example, an alkyl group provided for reducing the reactivity of the crosslinking group). The crosslinking agent has at least two crosslinking groups, and the crosslinking groups are either crosslinking group having no protecting group (for example, methylol and NH groups), or crosslinking group from which a protecting group can be removed by a proton released from the methylol group or the NH group of the crosslinking agent in the absence of a catalyst.

Further features of the present invention will become apparent from the following description of exemplary embodiments with reference to the attached drawings.

DESCRIPTION OF THE EMBODIMENTS

An organic semiconductor device according to an embodiment of the present invention includes an organic semiconductor, insulators, and electric conductors.

The insulators cover the electric conductors serving as electrodes to establish electrical insulation between the electric conductors and between the electric conductors and the organic semiconductor. Exemplary insulators include insulating interlayers, device separation films, and gate insulating films. The insulators also include members provided between the organic semiconductor or the electric conductors and the outside of the device, such as a sealant or a protecting member.

The insulators are generally in a form of a layer or a film, and may be referred to as insulating layers or insulating films in the description. However, the insulating layers or the insulating films used herein are not complete layers or films, and may have, for example, island-shaped structures.

A field-effect transistor including an organic semiconductor according to an embodiment of the present invention will now be described.

The field-effect transistor includes an organic semiconductor layer, insulators, and electric conductors. The electric conductors of the field-effect transistor include a gate electrode, a source electrode, and a drain electrode. The organic semiconductor layer responds to the voltage applied to the gate electrode. Specifically, the electrical characteristics of the organic semiconductor layer are changed depending on the electric field produced by applying a voltage to the gate electrode. More specifically, the electrical conductivity of the organic semiconductor layer, or the current flowing through the organic semiconductor layer, is varied depending on the changes in electric field. At least one of the insulators of the field-effect transistor is disposed between the gate electrode and the organic semiconductor layer to serve as a gate insulating layer.

The gate insulating layer not only electrically insulates the gate electrode from the organic semiconductor layer, but also induces a positive or negative charge at the interface with the organic semiconductor when a voltage is applied to the gate electrode.

The gate insulating layer can also be used to insulate the gate electrode from the source electrode and the drain electrode.

In addition to the gate insulating layer, the field-effect transistor includes other insulating layers, such as a sealant for insulating the electrodes and the organic semiconductor layer from the outside, and an insulating interlayer or a device separation film for insulating one electrode from another or one transistor from another.

Figure 1:
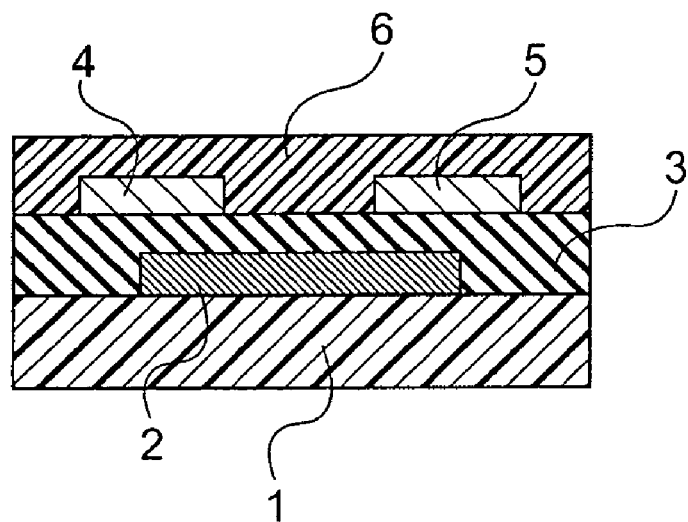
FIG. 1 is a schematic fragmentary enlarged sectional view of a field-effect transistor including a gate electrode, a gate insulating layer, a source electrode, a drain electrode, and an organic semiconductor layer, according to an embodiment of the present invention.

FIG. 1 is a schematic sectional view of an organic semiconductor device (field-effect transistor) according to an embodiment. The organic semiconductor device includes a substrate 1, a gate electrode 2, a gate insulating layer 3, a source electrode 4, a drain electrode 5, and an organic semiconductor layer 6. The gate electrode 2 is formed on the surface of the substrate 1 and covered with the gate insulating layer 3. The source electrode 4 and the drain electrode 5 are formed with a distance on the surface of the gate insulating layer 3. The source electrode 4, the drain electrode 5, and the surface between these electrodes of the gate insulating layer 3 are covered with the organic semiconductor layer 6. The source and drain electrodes 4 and 5 are in contact with the organic semiconductor layer 6. Although the embodiment illustrates a typical field-effect transistor, the device may be a vertical transistor or any other type of transistor.

As mentioned above, the gate insulating layer used in the embodiment not only electrically insulates the gate electrode from the organic semiconductor layer, but also induces a positive or negative charge at the interface with organic semiconductor when a voltage is applied to the gate electrode. In order to induce the charge efficiently, it is preferable that the insulating layer and the organic semiconductor layer form a uniform interface. The inventors of the present invention have conducted intense research for a material which can form a thin insulating layer having a uniform surface even on an uneven electrode formed on a resin substrate, and from which a catalyst or an uncured component does not precipitate at the interface between the insulating layer and the organic semiconductor layer nor thus contaminate the layers. As a result, it has been found that a cured material formed from a composition containing a specific organic resin and crosslinking agent can be a proper insulating layer.

The cure material suitable for the insulating layer can be formed of a composition containing an organic resin having a hydroxyl group and a crosslinking agent having at least two crosslinking groups at least one of which is a methylol group or a NH group.

The resin having a hydroxyl group can be a resin having an aliphatic alcoholic hydroxyl group or a phenolic hydroxyl group. Examples of the resin having an aliphatic alcoholic hydroxyl group include, but not limited to, poly(hydroxyethyl methacrylate), poly(hydroxyethyl acrylate), poly(hydroxypropyl methacrylate), poly(hydroxypropyl acrylate), poly(4-vinylcyclohexanol), polyvinyl alcohol, and their copolymers. Examples of the resin having a phenolic hydroxyl group include, but not limited to, phenol resins, such as phenol novolak resins, cresol novolak resins and their modified resins, and polyvinylphenols and their copolymers.

Among these, preferred are resins having a phenolic hydroxyl group. The resins having a phenolic hydroxyl group can be easily dissolved in various types of solvent, and accordingly easily applied onto various types of substrate to form a uniform thickness. Besides, such resins can be a strong and highly insulating film after being cured.

The resin having a hydroxyl group used in the embodiment can be a polymer or an oligomer having a number average molecular weight (Mn) between 250 and less than 500,000. A resin having an Mn of less than 250 may result in a film having an insufficient strength after being cured. A resin having an Mn of 500,000 or more may rapidly increase the viscosity in a solution to degrade the film formability. Preferred Mn is between 350 and less than 200,000.

As the molecular weight distribution of the resin is reduced, the melt viscosity during heating and melting becomes uniform, and accordingly the uniformity in thickness and the insulation properties of the resulting film can be increased. The preferred molecular weight distribution is therefore 2.5 or less. More preferably, the molecular weight distribution is 2 or less.

In the insulating layer of the organic semiconductor device, the content of low-molecular-weight components, which are likely to contaminate the organic semiconductor layer, is preferably low. Therefore the insulating layer is preferably formed of a resin containing no low-molecular-weight components, such as monomers. It is however difficult to eliminate low-molecular-weight components completely from the resin. In the embodiment of the present invention, the resin can contains 5 percent by weight or less, preferably 2 percent by weight or less, of monomers relative to the total weight of the resin before adding the crosslinking agent.

In the insulating layer, the content of alkali metals that are likely to contaminate the organic semiconductor layer, such as sodium, is extremely low. Specifically, the sodium content can be 20 ppm or less, and preferably 5 ppm or less. The sodium and other alkali metals in the insulating layer can be removed by repeatedly washing the insulating layer with water, or by allowing the thermally curable resin composition for forming the insulating layer through an ultrafilter or an ion-exchange resin. However, if the resin contains too much alkali metal, they are difficult to remove by the above process. Therefore the sodium content in the resin is preferably 20 ppm or less.

The softening point of the resin can be in the range of 60 to 170° C. A resin having a softening point of less than 60° C. may have an insufficient strength after being cured. A resin having a softening point of more than 170° C. may not sufficiently reflow over the resin substrate when it is cured by heating, and thus may make it difficult to form an even film on the surface of the electrode. Preferably, the softening point is in the range of 70 to 150° C.

The resin content in the cured material can be in the range of about 30 to 90 percent by weight relative to the total weight of the cured material. A resin content of less than 30 percent by weight may not lead to a sufficiently strong uniform film. A resin content of more than 90 percent by weight may not lead to a sufficiently cured film, and accordingly the resulting film may not be resistant to heat or solvents. Preferably, the resin content in the cured material is in the range of about 45 to 85 percent by weight.

The strength of the cured film can be increased by combined use of a phenol resin and a crosslinking agent.

The crosslinking agent has at least two crosslinking groups, and at least one of the crosslinking groups is a methylol group or an NH group.

The methylol group reacts with the resin to form a covalent bond by heating. Such a methylol group may be a hydroxymethyl group bound to a benzene ring directly or to an amino group of a melamine ring. Also, the methylol group easily releases a proton. The proton removes a protecting group of other crosslinking groups so that the crosslinking groups react with the hydroxyl group of the resin.

The NH group releases a proton that removes the protecting group of the crosslinking groups, as with the methylol group. In addition, the NH group reacts with the resin or other crosslinking groups to form a covalent bond.

Such an NH group may be derived from an amino group on a melamine skeleton. One of the hydrogen atoms of the amino group is replaced with a crosslinking group. Since the amino group (—$NH_2$) on the melamine skeleton can be expressed by H—NH—, the NH of the amino group can be the NH group as the crosslinking group of the embodiment. The NH group is preferably expressed by —N=$CR_{20}$—NH— (wherein $R_{20}$ represents an organic group but not proton, and —N=$CR_{20}$ may form a ring system). This form easily releases H.

Examples of the crosslinking agent having at least two crosslinking groups at least one of which is a methylol group or an NH group include the compounds expressed by the following general formulas:

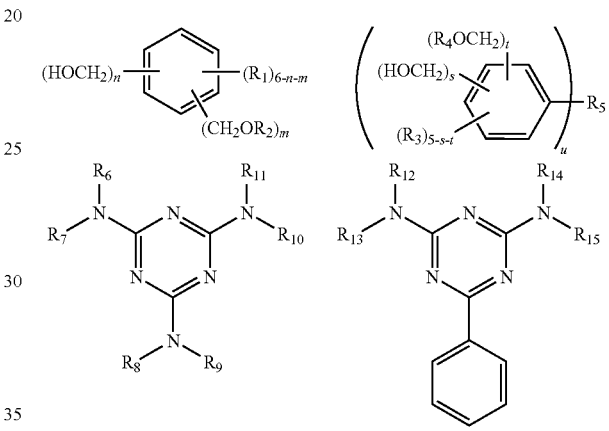

In the formulas, $R_1$ and $R_3$ each represent at least one selected from the group consisting of hydrogen, halogen, hydroxyl, thiol, amino, nitro, cyano, carboxyl, amido, and aryl, and alkyl, alkenyl, alkynyl, alkoxyl, alkylthio, hydroxyalkyl and acyl having carbon numbers in the range of 1 to 12. $R_2$ and $R_4$ each represent at least one selected from the group consisting of alkoxymethyl and acyloxymethyl having carbon numbers in the range of 1 to 6. $R_5$ represents a u-valent organic group and u represents an integer in the range of 1 to 5. n represents an integer in the range of 1 to 6, m represents an integer in the range of 0 to 5, and $2 \leq n+m \leq 6$ holes. s Represents an integer in the range of 1 to 5, t represents an integer in the range of 0 to 4, and $2 \leq s+t \leq 5$ holes. The $R_3$'s of the groups bound to the $R_5$ may be the same or different, and the $R_4$'s may also be the same or different.

$R_6$, $R_7$, $R_8$, $R_9$, $R_{10}$, and $R_{11}$ each represent at least one selected from the group consisting of —$CH_2OH$, —H, and —$CH_2OR_{16}$, and alkyl, alkenyl, alkynyl, alkoxyl, alkylthio, hydroxyalkyl and acyl having carbon numbers in the range of 1 to 12. At least one of the $R_6$, $R_7$, $R_8$, $R_9$, $R_{10}$, and $R_{11}$ is —$CH_2OH$ or —H and at least two of the $R_6$, $R_7$, $R_8$, $R_9$, $R_{10}$, and $R_{11}$ are —$CH_2OH$, —H, or —$CH_2OR_{16}$. $R_{12}$, $R_{13}$, $R_{14}$, and $R_{15}$ each represent at least one selected from the group consisting of —$CH_2OH$, —H, and —$CH_2OR_{18}$, and alkyl, alkenyl, alkynyl, alkoxyl, alkylthio, hydroxyalkyl and acyl having carbon numbers in the range of 1 to 12. At least one of the $R_{12}$, $R_{13}$, $R_{14}$, and $R_{15}$ is —$CH_2OH$ or —H and at least two of the $R_{12}$, $R_{13}$, $R_{14}$, and $R_{15}$ are —$CH_2OH$, —H, or —$CH_2OR_{18}$. $R_{16}$ and $R_{18}$ each represent at least one selected from the group consisting of alkoxymethyl and acyloxymethyl having carbon numbers in the range of 1 to 6. The $R_{16}$'s may be the same or different and the $R_{18}$'s may be the same or different.
Examples of the crosslinking agent having at least one methylol group are listed below, but not limited to:
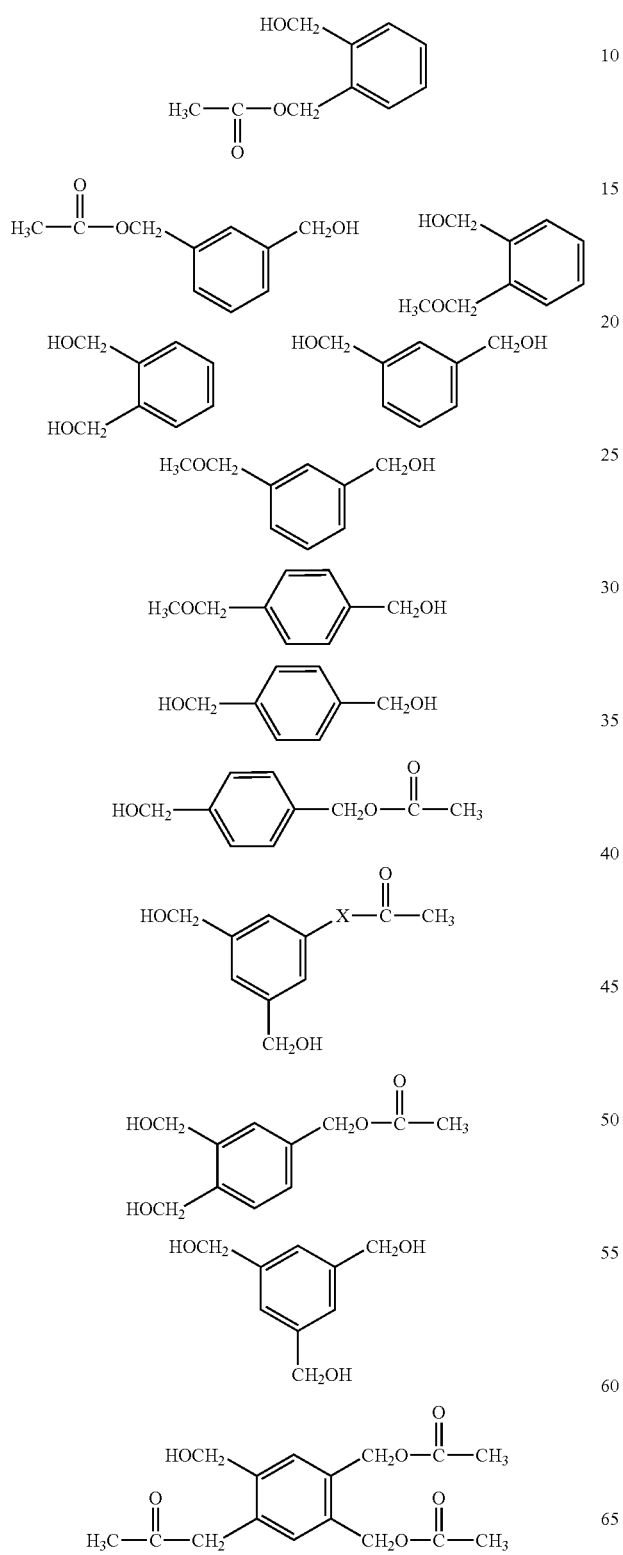
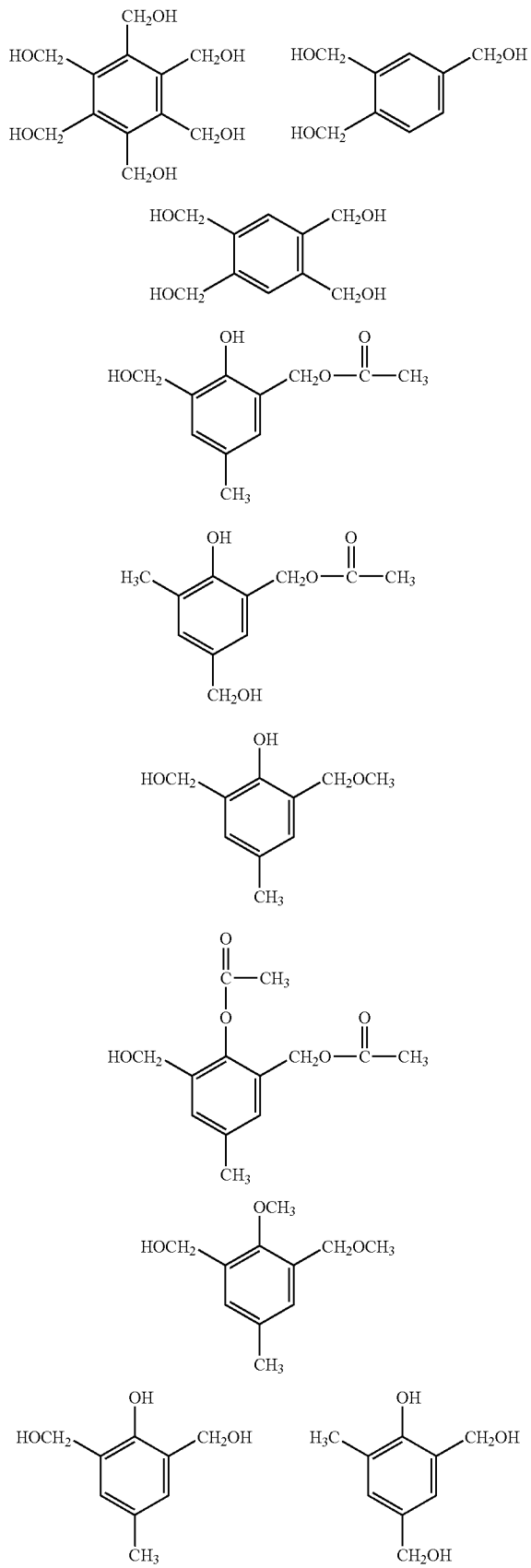

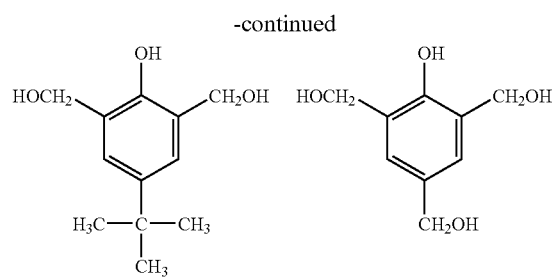
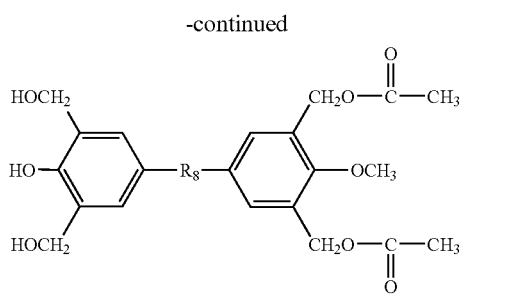
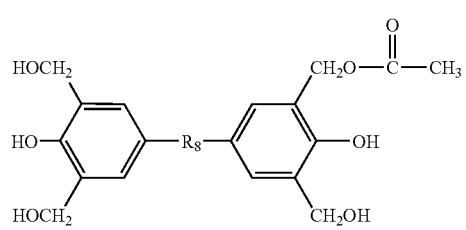
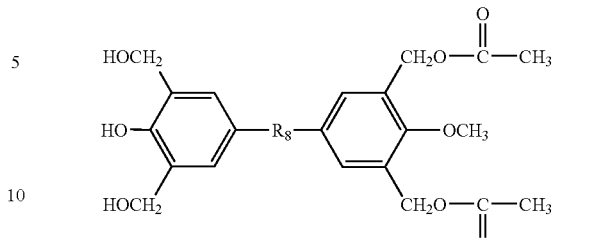
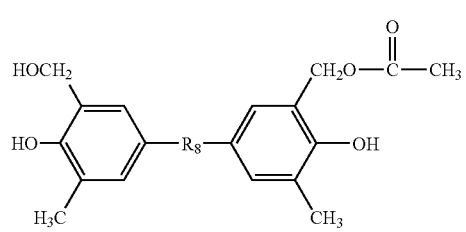
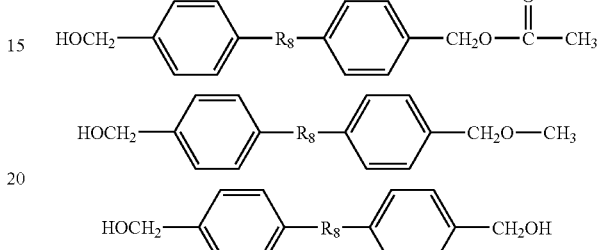
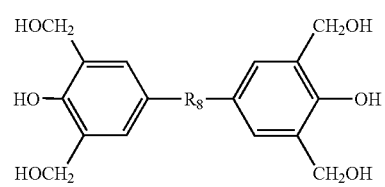
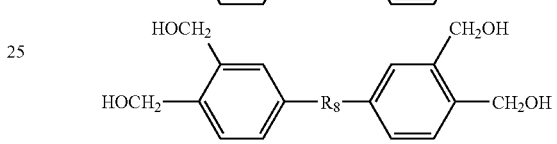
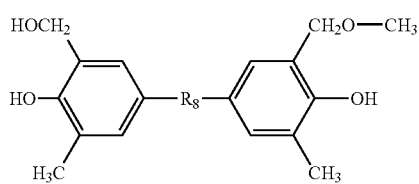
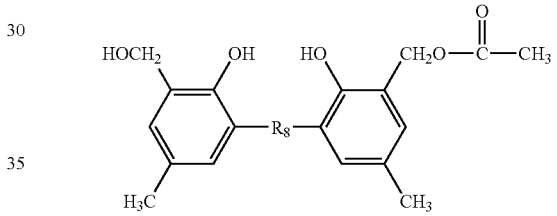
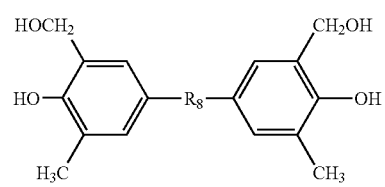
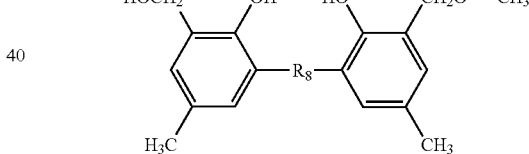
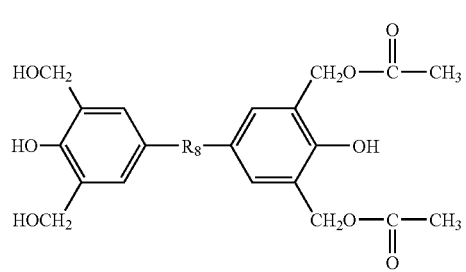
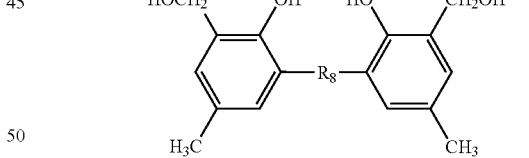
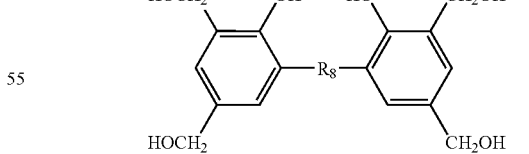

-continued
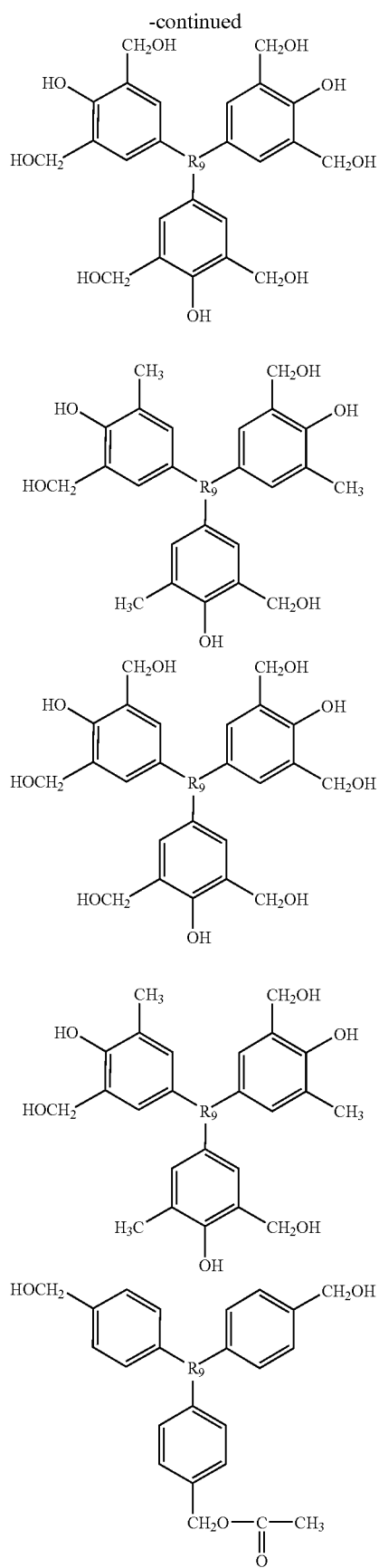
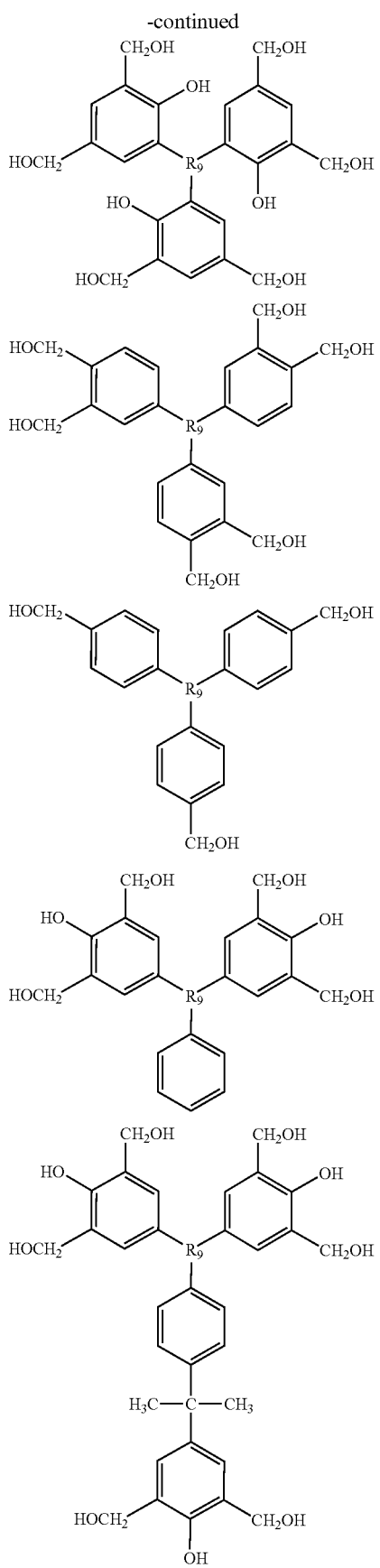

-continued
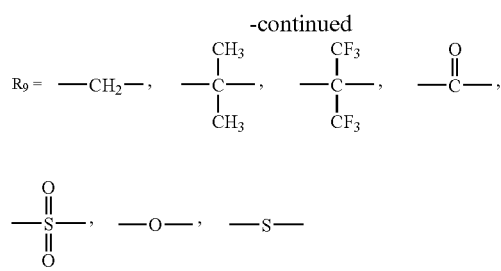
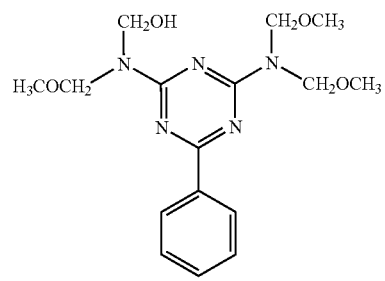
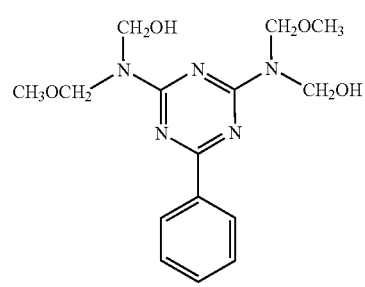
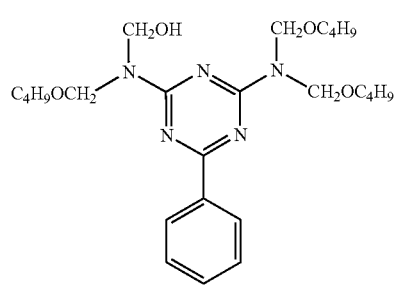
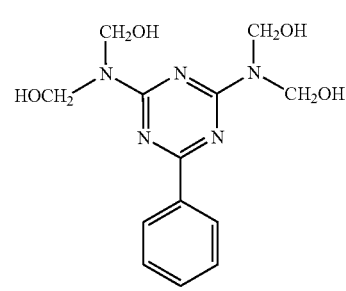
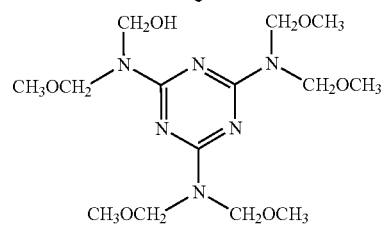
-continued
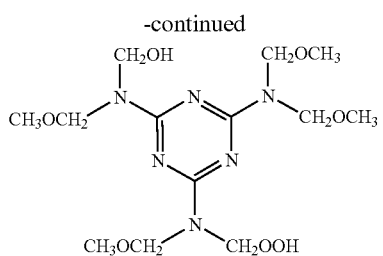
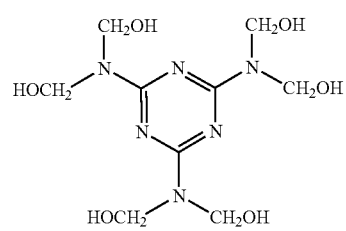
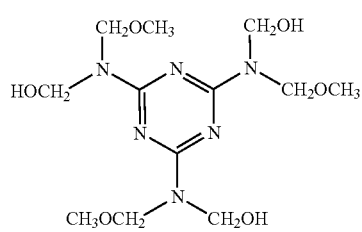
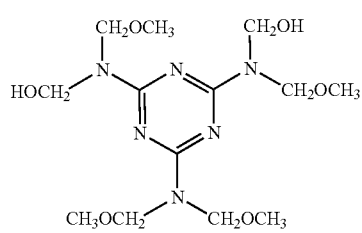
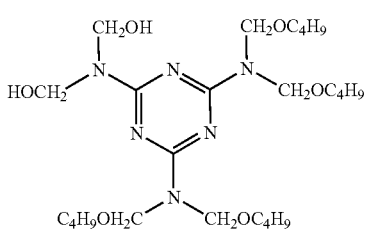
Examples of the crosslinking agent having at least one NH group are listed below, but not limited to:
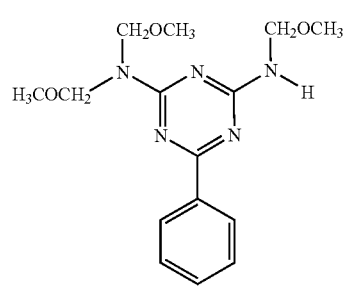

-continued

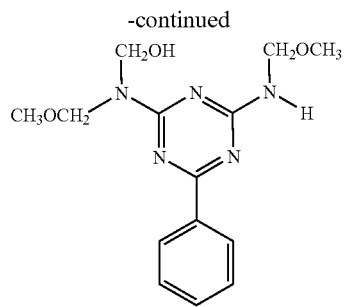
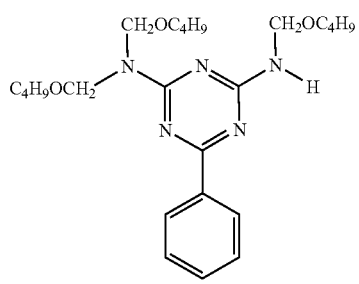
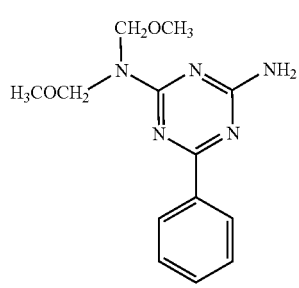
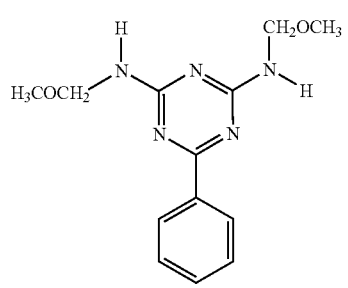
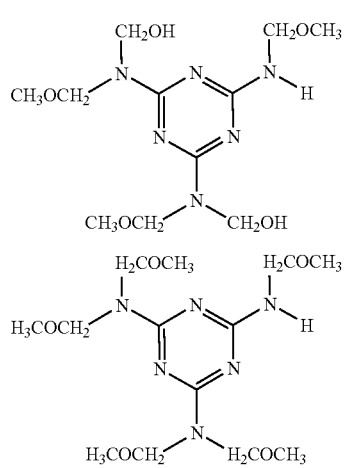

-continued

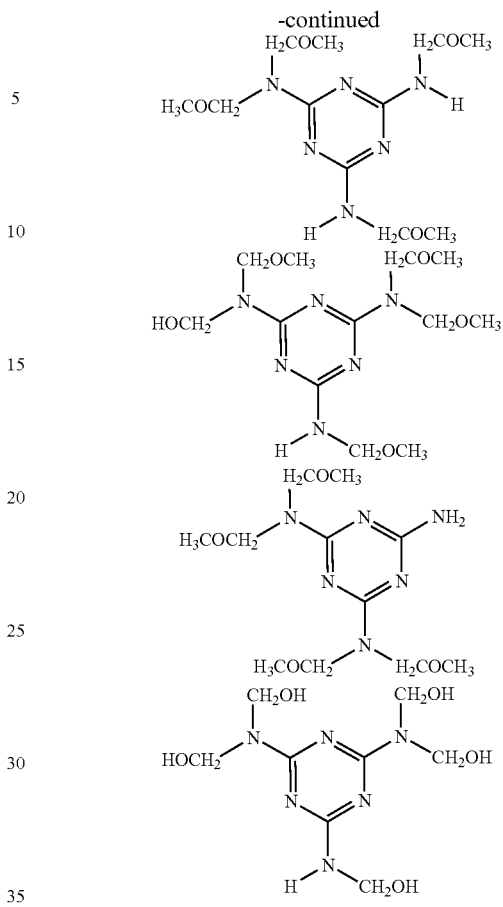

The methylol group is generally formed by condensation of formalin with a phenol compound in the presence of an alkali, or by reduction of an ester with lithium aluminium hydride. The methylol compound thus synthesized may contain a residual alkali metal, such as sodium. The residual alkali metal may contaminate the organic semiconductor layer after curing of the insulating layer. It is therefore preferable that the alkali metal remaining in the crosslinking agent be removed as much as possible. Specifically, the sodium content in the crosslinking agent can be about 20 ppm or less, preferably 5 ppm or less, relative to the total amount of the crosslinking agent.

Relative to 100 parts by weight in total of the resin and the crosslinking agent, 15 to 45 parts by weight of the crosslinking agent can be added. Less than 15 parts or more than 45 parts by weight of the crosslinking agent disadvantageously requires too long curing time, which may cause the surface of the resulting film to have a higher roughness, and also degrade the uniformity of a surface treatment layer and an organic semiconductor layer on the resulting film. Preferably, 20 to 40 parts by weight of the crosslinking agent is added to 100 parts by weight in total of the resin and the crosslinking agent.

For forming the insulating layer, the reaction between the resin and the crosslinking agent (curing reaction by crosslinking) may need to be controlled depending on the state of the surface underlying the insulating layer. In such a case, a small amount of catalyst can be added.

Catalysts suitable for the reaction between the resin and the crosslinking agent include: carboxylic acids, such as formic acid, acetic acid, and oxalic acid; and sulfonic acids, such as p-toluenesulfonic acid and camphorsulfonic acid. Among these, preferred are sulfonic acids, such as p-toluenesulfonic acid, camphorsulfonic acid, and trifluoromethanesulfonic acid. In order to enhance the stability of the solution, an amine sulfonate can be used. Such amine sulfonates include pyridine p-toluenesulfonate.

A photoacid catalyst may be used. Examples of the photoacid catalyst include trifluoromethanesulfonic acid, hexafluorophosphoric acid, diallyliodonium salts such as 9,10-dimethoxyanthracenesulfonic acid, triallylsulfonium salts, o-nitrobenzyl esters, and bis(trichloromethyl)-s-triazine compounds. If a photocatalyst is used, light exposure and heating are required after film formation.

Relative to 100 g in total of the resin and the crosslinking agent, about below 3 mmol of catalyst can be added. More than 3 mmol of catalyst may not only degrade the stability of the solution, but also cause an excessive amount of the catalyst to precipitate on the surface of the insulating layer, thus degrading the mobility. Preferably, about below 2 mmol of catalyst is added to 100 g in total of the resin and the crosslinking agent.

Solvents for dissolving the resin and other components include ethylene glycol monomethyl ether, methyl cellosolve acetate, diethylene glycol monomethyl ether, propylene glycol, propylene glycol monomethyl ether, propylene glycol monobutyl ether, propylene glycol monomethyl ether acetate, toluene, xylene, methylethyl ketone, methylisobutyl ketone, cyclohexanone, ethyl 2-hydroxypropionate, butyl acetate, ethyl lactate, butyl lactate, ethanol, 1-propanol, 2-propanol, 1-butanol, 2-butanol, and isobutanol. These organic solvents may be used singly or in combination.

Among these solvents, preferred are propylene glycol monomethyl ether, propylene glycol monomethyl ether acetate, ethyl lactate, butyl lactate, cyclohexanone, ethanol, and 1-butanol, from the viewpoint of ease of leveling.

The concentration of the resin in solution is adjusted according to the thickness of the film, and is preferably about 1 to 50 percent by weight. The resin solution is applied by spin casting, casting, dipping, die coating, slit coating, dropping, offsetting, offset or screen printing, or ink-jetting. In order to maintain the smoothness of the resulting film, it is preferable that the resin solution contain dust or foreign matter as little as possible. Accordingly, the resin solution is preferably filtered through a membrane filter.

In order to enhance the wettability on and the contact with the substrate or electrode, of the resin solution, a surfactant or a coupling agent may be added to the resin solution to the extent that the insulation and other electrical properties do not deteriorate.

The thermally curable resin composition can be cured by heating at about 100 to 200° C. The curable resin composition melted by heating can be allowed to flow to planarize the asperities of the surface of the substrate before curing. If the curing temperature is lower than 100° C., the resin cannot be sufficiently cured and consequently the resulting film cannot have a high deflection temperature and a high strength. If the curing temperature is higher than 200° C., the thermally curable resin composition may be cured before it is sufficiently spread, by rapid increase of temperature, and consequently the surface of the substrate may not be planarized. The resin can be heated by a variety of techniques, such as in a hot air circulation oven, a vacuum oven and an electric furnace, on a hot plate, and with an infrared lamp.

Whether the insulating layer has been sufficiently cured can be examined by measuring the solvent resistance, the infrared spectrum, or the refractive index. In particular, the measurement of the solvent resistance to dimethylformamide (DMF) is the simplest. When the insulating layer does not dissolve or swell even by immersion in DMF for 5 minutes, it is determined that the insulating layer has been sufficiently cured.

If the insulating layer is used as the gate insulating layer 3, the thickness of the gate insulating layer can be in the range of 100 nm to 1 μm, depending on the surface state of the gate electrode. A thickness of less than 100 nm makes it difficult to be a dense film on an electrode with a rough surface. On the other hand, a thickness of more than 1 μm increases the absolute value of the drain-source current Id, and accordingly a high gate voltage is required. The thickness of the gate insulating layer is preferably in the range of 150 nm to 800 nm.

The surface at the organic semiconductor layer side of the gate insulating layer can have an average surface roughness (Ra') of 5 nm or less. If the gate insulating layer has an Ra' of more than 5 nm, the thickness and the crystal growth of the organic semiconductor layer formed on the gate insulating layer become nonuniform, and consequently the mobility may be reduced. Preferably, the Ra' is in the range of 0.1 to 3 nm. The average surface roughness (Ra') mentioned herein is measured with a scanning probe microscope SPI 3800 (product name) manufactured by Seiko Instruments, and is a parameter of the smoothness of a film surface.

The insulating layer used in the embodiment has high insulation properties, and exhibits a volume resistivity of $1 \times 10^{13}$ Ω·cm or more under an applied voltage of 40 V or less. The volume resistivity mentioned herein is obtained from leak current density measured with a parameter analyzer 4156C manufactured by Agilen.

The substrate 1 used in the embodiment can be prepared by forming silicon, glass, a metal, or a resin into a plate, foil, film, or sheet. A resin substrate is particularly suitable from the viewpoint of flexibility and workability. Exemplary materials of the resin substrate include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyacrylate (PAR), and polyamidoimide (PAI). The resin substrate may also be made of a polycycloolefin resin, an acrylic resin, polystyrene, ABS, polyethylene, polypropylene, a polyamide resin, a polycarbonate resin, a polyphenylene ether resin, or a cellulose resin. Alternatively, the substrate may be made of an organic-inorganic composite prepared by adding inorganic oxide particles or binding an inorganic material to these resins.

The surface of the substrate may be polished or coated with a resin or an inorganic oxide so as to be flat and smooth and have a solvent resistance and a heat resistance. In the examples described below, the substrate whose surface is not coated may be referred to as an uncoated substrate, for the distinction from the substrate whose surface is coated with a resin. The coated substrate may be referred to as simply a substrate.

For the formation of the electrodes, any electroconductive material can be used without particular limitation. Exemplary electroconductive materials include platinum, gold, silver, nickel, chromium, copper, iron, tin, antimony, lead, tantalum, indium, aluminum, zinc, magnesium and their alloys, and electroconductive metal oxides such as indium tin oxide. The materials also include inorganic or organic semiconductors whose electrical conductivity is enhanced by doping, such as silicon single crystal, polysilicon, amorphous silicon, germanium, graphite, polyacetylene, poly-p-phenylene, polythiophene, polypyrrole, polyaniline, poly(thienylenevinylene), and poly-p-phenylenevinylene. For the source electrode 4 or the drain electrode 5, a material having a low electric resistance at the surface in contact with the semiconductor layer is preferably selected from the above-listed electrode materials. The electrode may be formed by, for example, sputtering, vapor deposition, printing using solution, dispersion liquid, or paste, or ink-jetting. In particular, an aggregate of electroconductive particles having diameters between 5 nm or more and less than 2 μm, formed by printing of solution, dispersion liquid, or paste or by ink-jetting is preferably used as the electrode, because it can be easily formed without using vacuum equipment. Specifically, such an electrode is formed of, for example, a dispersion liquid or solution of an electroconductive polymer, metal particles, a metal oxide, a slurry or paste of carbon black, or an organic metal solution. Preferred electroconductive polymers include poly(ethylenedioxythiophene)/poly(4-styrene sulfonic acid) and poly(p-aniline)/camphorsulfonic acid. Exemplary metal particles include silver or gold particles of several tens of nanometers in diameter and nanoparticles of nickel or other metals. Exemplary metal oxides include particles of zinc oxide, titanium oxide, tin oxide, antimony oxide, indium oxide, bismuth oxide, indium oxide doped with tin, tin oxide doped with antimony, and zirconium oxide. Exemplary organic metals include silver salts of organic acids. The dispersion liquid or solution of these particles may contain a small amount of surfactant or resin so that the particles are uniformly dispersed. The surfaces of the particles may be modified with organic molecules.

In the aggregate of electroconductive particles, electroconductive particles with diameters between, for example, 5 nm or more and less than 2 μm are in contact with each other to deposit. The particles may be fused to bond to each other, or closely deposited.

In order to reduce the resistance, the material applied for the formation of the electrode is often subjected to some heat treatment. In this instance, the heating temperature can be in the range of 120 to 200° C., in view of use of the resin substrate. The thickness of the electrode can be, but depending on the specific resistance of the electroconductive material, in the range of about 30 nm to 2 μm, in view of ease of covering step heights during film deposition and the resistance of the film.

The organic semiconductor layer 6 of the embodiment can be made of a π-electron conjugated aromatic compound, a chain compound, an organic pigment, or an organic silicone compound. Exemplary materials of the organic semiconductor layer 6 include polyacens such as pentacene, tetracene, and anthracene, thiophene oligomer derivatives, phenylene derivatives, tetraazaporphyrin compounds such as phthalocyanine compounds, porphyrin compounds, and low-molecular materials such as cyanine dye. The materials further include polymers such as polyacetylene derivatives, polythiophene derivatives, and polyphenylenevinylene derivatives, oligomers, and dendrimers. However, the material of the organic semiconductor layer is not particularly limited to the above-listed compounds.

Preferably, the organic semiconductor layer 6 is made of a porphyrin compound. One of the typical porphyrin compounds may be benzoporphyrin. Benzoporphyrin can increase the mobility of the resulting device by applying a solution of its precursor in a bicyclo form soluble in organic solvent, and subsequently applying heat or any other energy to the solution to convert into porphyrin crystal. Combined use of this layer with the insulating layer can achieve a field-effect transistor exhibiting a uniform and high mobility and a high on/off ratio.

The field-effect transistor of the embodiment can have a mobility of about $1 \times 10^3$ cm$^2$/V·s or more and an on/off ratio of about 100 or more.

In order to align the orientation of the molecules or promote the crystal growth of the organic semiconductor layer 6, the surface of the gate insulating layer 3, the source electrode 4, or the drain electrode 5 may be modified by, for example, dry treatment using ozone, plasma, or hexamethyldisilazane gas, or wet treatment using a solution of tetraalkoxysilane, trichlorosilane, or a surfactant in an organic solvent. Alternatively, the surface of the gate insulating layer 3 or the source and drain electrodes 4 and 5 may be coated with a thin polymer film to align the orientation or promote the crystal growth of the organic semiconductor layer 6, provided that the coating does not act as an electric resistance between the source and drain electrodes 4 and 5 and the organic semiconductor layer 6.

The field-effect transistor is not necessarily in a form of a thin film, and may be three-dimensional.

Although the embodiment mainly illustrates the gate insulating layer of the field-effect transistor, the effect of preventing migration can be produced not only by using the insulating layer of the embodiment as an insulating layer or a sealant provided in transistors, but also by using it as an insulating layer or a sealant provided in other types of organic semiconductor device. Hence, the present is not limited to the field-effect transistor.

EXAMPLES

The present invention will further be described with reference to examples, but the invention is not limited to the examples.

Glass Substrate 1 with ITO Electrode

A 0.7 mm thick glass substrate provided with an indium tin oxide (hereinafter referred to as ITO) layer of about 150 nm in thickness was washed with acetone and isopropyl alcohol and dried. The surface roughness (Ra') of the substrate was measured with a scanning probe microscope (SPI 3800, manufactured by Seiko Instruments) and resulted in 7 nm.

Glass Substrate 2 with Silver Electrode

A 1 mm thick glass substrate was washed with acetone and isopropyl alcohol and dried. The surface of the substrate was coated with a dispersion liquid of silver particles in alcohol (Fine Sphere SVE 102, produced by Nippon Paint) by dipping, followed by baking at 180° C. for 30 minutes in a hot air circulation oven. Glass substrate 2 with a 150 nm thick silver electrode was thus prepared. The surface roughness (Ra') of this substrate was 10 nm.

Resin Substrate 3 with Silver Electrode

A 188 μm thick uncoated substrate of PET (HLA-188, produced by Teijin DuPont Films) was provided with a 3 μm thick planarizing layer formed of a cured material containing phenol novolak resin, melamine crosslinking agent (CYMEL 303, produced by Cytec Industries), and an acid catalyst (Catalyst 4040, produced by Cytec Industries) at a weight ratio of 60:40:2. The surface of the resulting resin substrate was coated with a dispersion liquid of silver particles in alcohol (Fine Sphere SVE 102, produced by Nippon Paint) by dipping, followed by baking at 180° C. for 30 minutes in a hot air circulation oven. A resin substrate 3 with a 150 nm thick silver electrode was thus prepared. The surface roughness (Ra') of this resin substrate was 10 nm.

Resin Substrate 4 with Silver Electrode

The surface of a 200 μm thick organic-inorganic hybrid substrate (HT Substrate, manufactured by Nippon Steel Chemical) was coated with a dispersion liquid of silver particles in alcohol (Fine Sphere SVE 102, produced by Nippon Paint) by dipping, followed by baking at 180° C. for 30 minutes in a hot air circulation oven. A resin substrate 4 with a 150 nm thick silver electrode was thus prepared. The surface roughness (Ra') of this resin substrate was 10 nm.

Preparation of Organic Resin Solution 1

In 87 g of 1:1 mixed solvent of 1-butanol and ethanol, 9.75 g of phenol novolak resin (PN, number average molecular weight: 770, molecular weight distribution: 1.5, sodium content: 0.1 ppm or less) as the resin and 3.25 g of 2,6-dihydroxymethyl-4-methylphenol (DHMP, sodium content: 3 ppm or less) expressed by formula (2) as the crosslinking agent were completely dissolved at room temperature. Then, the solution was filtered through a 0.2 μm PTFE membrane filter to obtain organic resin solution 1.

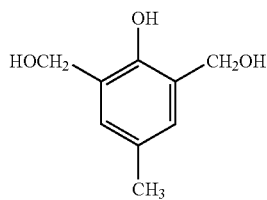

(2)

Preparation of Organic Resin Solution 2

Using 9.1 g of phenol novolak resin (PN, number average molecular weight: 770, molecular weight distribution: 1.5, sodium content: 0.1 ppm or less) as the resin and 3.9 g of 2,2-bis(3,5-dihydroxymethyl-4-hydroxy)propane (BDHP, sodium content: 3 ppm or less) expressed by formula (3) as the crosslinking agent, organic resin solution 2 was prepared in the same manner as organic resin solution 1.

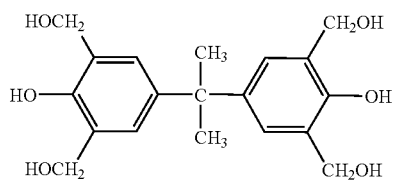

(3)

Preparation of Organic Resin Solution 3

Organic resin solution 3 was prepared in the same manner as organic resin solution 2 except that 1,3,5-trihydroxymethylbenzene (THMB, sodium content: 3 ppm or less) expressed by formula (4) was used as the crosslinking agent.

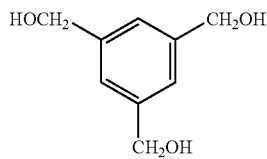

(4)

Preparation of Organic Resin Solution 4

Organic resin solution 3 was prepared in the same manner as organic resin solution 2 except that a crosslinking agent containing a melamine compound having an NH group and a methylol group (Nikalac MX-750LM, produced by Sanwa Chemical, sodium content: 0.2 ppm or less) expressed by formula (5) was uses as the crosslinking agent.

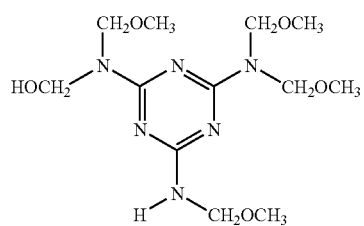

(5)

Preparation of Organic Resin Solution 5

Organic resin solution 5 was prepared in the same manner as organic resin solution 2 except that an o-cresol novolak resin (o-CN, number average molecular weight: 840, molecular weight distribution: 1.2, sodium content: 0.1 ppm or less) was used as the resin.

Preparation of Organic Resin Solution 6

Organic resin solution 6 was prepared in the same manner as organic resin solution 4 except that an o-cresol novolak resin (o-CN, number average molecular weight: 840, molecular weight distribution: 1.2, sodium content: 0.1 ppm or less) was used as the resin.

Preparation of Organic Resin Solution 7

In 91 g of 1:1 mixed solution of 1-butanol and ethanol, 6.3 g of poly(4-vinylphenol)(VP-8000, produced by Nippon Soda, number average molecular weight: 11,000, molecular weight distribution: 1.1, sodium content: 1 ppm or less) as the resin) and 2.7 g of 2,2-bis(3,5-dihydroxymethyl-4-hydroxy) propane (sodium content: 3 ppm or less) as the crosslinking agent were completely dissolved at room temperature. Then, the solution was filtered through a 0.2 μm PTFE membrane filter to obtain organic resin solution 7.

Preparation of Organic Resin Solution 8

Organic resin solution 8 was prepared in the same manner as organic resin solution 7 except that a melamine crosslinking agent having a NH group and a methylol group (Nikalac MX-750LM, produced by Sanwa Chemical, sodium content: 0.2 ppm or less) was used as the crosslinking agent.

Preparation of Organic Resin Solution 9

Organic resin solution 9 was prepared in the same manner as organic resin solution 2 except that a methylated methylolmelamine crosslinking agent (Nikalac MW-100LM, produced by Sanwa Chemical, sodium content: 0.2 ppm or less) expressed by formula (6) was used as the crosslinking agent.

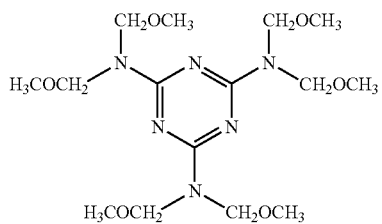

(6)

Preparation of Organic Resin Solution 10

Organic resin solution 10 was prepared in the same manner as organic resin solution 9 except that 0.2 g of p-toluenesulfonic acid monohydrate (PTS) was added as a catalyst.

Preparation of Organic Resin Solution 11

Organic resin solution 11 was prepared in the same manner as organic resin solution 9 except that poly(4-vinylphenol) (VP-8000, produced by Nippon Soda, number average molecular weight: 11,000, molecular weight distribution: 1.1, sodium content: 1 ppm or less) was used as the resin.

Preparation of Organic Resin Solution 12

Organic resin solution 12 was prepared in the same manner as organic resin solution 11 except that 0.2 g of p-toluenesulfonic acid monohydrate (PTS) was added as a catalyst.

In the following Examples 1 to 19 and Comparative Examples 1 to 5, the insulating layer formed on each substrate was evaluated for its characteristics. Further, TFT 1 (Examples 20 to 36, Comparative Examples 6 to 9) containing an metal-free benzoporphyrin and TFT 2 (Examples 37 to 52, Comparative Examples 10 to 13) containing benzoporphyrin were prepared using some of the substrates with insulating layers of the Examples and Comparative Examples. The mobilities and on/off ratios of these TFTs were evaluated.

Examples 1 to 19, Comparative Examples 1 to 5

Insulating Layer Formation and Thickness Measurement

Substrates 1 to 4 with an electrode were each coated with any one of organic resin solutions 1 to 7 by dipping, followed by heating at 180° C. for 1 hour in a hot air circulation oven to form a cured organic resin layer (insulating layer). The thicknesses of the thermally cured resin layers were measured with a reflectance spectrophotometric thickness meter FE-3000 (product name) manufactured by Otsuka Electronics.

Average Surface Roughness Measurement

The average surface roughness (Ra) of each thermally cured resin layer (insulating layer) was measured with a scanning probe microscope SPI 3800 (product name) manufactured by Seiko Instruments.

Evaluation of Solvent Resistance

The thermally cured resin layer (insulating layer) was immersed in room-temperature dimethylformamide (DMF) for 5 minutes, and then the thickness was measured. When the difference between the thicknesses before and after DMF immersion was less than 2%, it was determined that the thermally cured resin layer has been sufficiently cured.

Evaluation of Insulation Properties

A 200 μm square gold electrode was formed on the thermally cured resin layer by vacuum vapor deposition. Then, the leak current density when a voltage of 0 to 40 V was applied in the thickness direction was measured with a parameter analyzer 4156C (product name) manufactured by Agilent, and the volume resistivity at a voltage of 40 V was calculated from the following Equation 1. The measurement was performed on 20 points for each thermally cured resin layer, and the number of points that did not produce dielectric breakdowns (number of non-breakdown points) was counted.

$$\text{Volume resistivity } (\rho v) = 1/\text{current density } (A/cm^2) \times \text{voltage } (V)/\text{thickness } (cm) \; [\Omega \cdot cm] \quad \text{Equation 1}$$

The characteristics of the insulating layers of Examples 1 to 19 and Comparative Examples 1 to 5 are shown in Table 1. The solvent resistances of the insulating layers whose difference between the thicknesses before and after DMF immersion was less than 2% were represented as "good". The solvent resistances of the other insulating layers are represented as "poor".

TABLE 1

| | Organic resin solution | Resin | Crosslinking agent | Catalyst | Substrate | Thickness (nm) | Ra (nm) | Solvent resistance | ρv (Ω·cm) | Non-breakdown points |
|---|---|---|---|---|---|---|---|---|---|---|
| Example 1 | Solution 1 | PN | DHMP | — | 1 | 600 | <0.6 | Good | $2.9 \times 10^{13}$ | 20/20 |
| Example 2 | Solution 1 | PN | DHMP | — | 3 | 600 | <0.6 | Good | $3.7 \times 10^{13}$ | 20/20 |
| Example 3 | Solution 2 | PN | BDHP | — | 1 | 520 | <0.6 | Good | $3.9 \times 10^{13}$ | 20/20 |
| Example 4 | Solution 2 | PN | BDHP | — | 2 | 500 | <0.6 | Good | $4.1 \times 10^{13}$ | 20/20 |
| Example 5 | Solution 2 | PN | BDHP | — | 3 | 500 | <0.6 | Good | $4.3 \times 10^{13}$ | 20/20 |
| Example 6 | Solution 2 | PN | BDHP | — | 4 | 500 | <0.6 | Good | $4.2 \times 10^{13}$ | 20/20 |
| Example 7 | Solution 3 | PN | THMP | — | 3 | 520 | <0.6 | Good | $3.9 \times 10^{13}$ | 20/20 |
| Example 8 | Solution 4 | PN | MX-750LM | — | 1 | 500 | <0.6 | Good | $3.3 \times 10^{13}$ | 20/20 |
| Example 9 | Solution 4 | PN | MX-750LM | — | 2 | 500 | <0.6 | Good | $3.6 \times 10^{13}$ | 20/20 |
| Example 10 | Solution 4 | PN | MX-750LM | — | 3 | 500 | <0.6 | Good | $4.7 \times 10^{13}$ | 20/20 |
| Example 11 | Solution 4 | PN | MX-750LM | — | 4 | 500 | <0.6 | Good | $4.9 \times 10^{13}$ | 20/20 |
| Example 12 | Solution 5 | o-CN | BDHP | — | 3 | 450 | <0.6 | Good | $4.2 \times 10^{13}$ | 20/20 |
| Example 13 | Solution 6 | o-CN | MX-750LM | — | 3 | 450 | <0.6 | Good | $4.5 \times 10^{13}$ | 20/20 |
| Example 14 | Solution 7 | VP-8000 | BDHP | — | 1 | 480 | <0.6 | Good | $8.9 \times 10^{13}$ | 20/20 |
| Example 15 | Solution 7 | VP-8000 | BDHP | — | 3 | 480 | <0.6 | Good | $1.3 \times 10^{14}$ | 20/20 |
| Example 16 | Solution 8 | VP-8000 | MX-750LM | — | 1 | 500 | <0.6 | Good | $2.5 \times 10^{14}$ | 20/20 |
| Example 17 | Solution 8 | VP-8000 | MX-750LM | — | 2 | 500 | <0.6 | Good | $1.0 \times 10^{14}$ | 20/20 |
| Example 18 | Solution 8 | VP-8000 | MX-750LM | — | 3 | 500 | <0.6 | Good | $1.1 \times 10^{14}$ | 20/20 |
| Example 19 | Solution 8 | VP-8000 | MX-750LM | — | 4 | 500 | <0.6 | Good | $1.3 \times 10^{14}$ | 20/20 |
| Comparative Example 1 | Solution 9 | PN | MW-100LM | — | 3 | 490 | 0.8 | Poor | $4.8 \times 10^{12}$ | 13/20 |
| Comparative Example 2 | Solution 10 | PN | MW-100LM | PTS (1.5 phr) | 1 | 500 | <0.6 | Good | $1.0 \times 10^{14}$ | 20/20 |
| Comparative Example 3 | Solution 10 | PN | MW-100LM | PTS (1.5 phr) | 3 | 500 | <0.6 | Good | $1.2 \times 10^{14}$ | 20/20 |
| Comparative Example 4 | Solution 11 | VP-8000 | MW-100LM | — | 3 | 500 | 1.0 | Poor | $7.0 \times 10^{12}$ | 18/20 |
| Comparative Example 5 | Solution 12 | VP-8000 | MW-100LM | PTS (1.5 phr) | 3 | 510 | <0.6 | Good | $2.2 \times 10^{14}$ | 20/20 |

Examples 20 to 36, Comparative Examples 6 to 9

Evaluation of TFT (FET) Characteristics

TFT 1 (Metal-Free Benzoporphyrin TFT)

Figure 2:
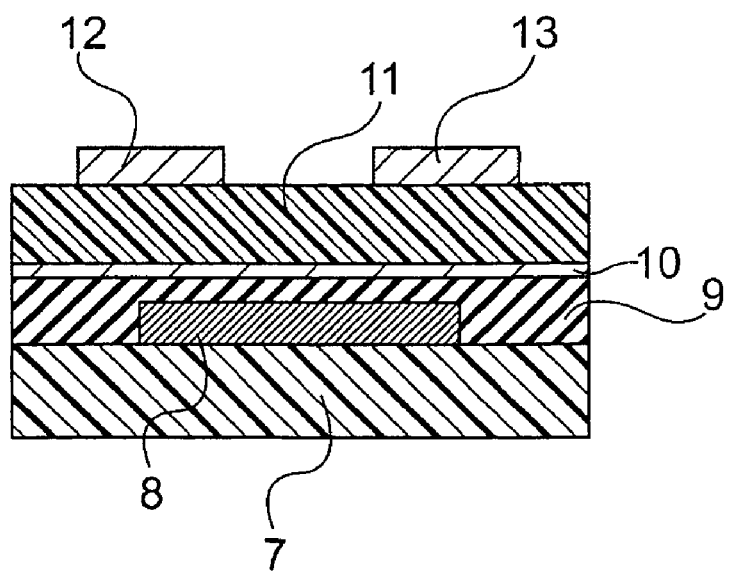
FIG. 2 is a schematic sectional view of the structure of field-effect transistors of Examples 1 to 19 and Comparative Examples 2 to 5, the field-effect transistors each including a substrate, a gate electrode, a gate insulating layer, a surface treatment layer, an organic semiconductor layer, a source electrode, and a drain electrode.

FIG. 2 is a schematic sectional view of a transistor including any one of the substrates including the insulating layer prepared in Examples 1 to 19 and Comparative Examples 2 to 5. The transistor includes a substrate 7, a gate electrode 8, a gate insulating layer 9, a surface treatment layer 10, an organic semiconductor layer 11, a source electrode 12, and a drain electrode 13.

A 10 nm thick surface treatment layer 10 of methylsilsesquioxane ladder polymer (Glass Resin GR-650, produced by Showa Denko) was formed on the surface of each board (corresponding to Examples 1 to 19 and Comparative Examples 2 to 5) prepared by depositing the gate electrode 8 and the gate insulating layer 9 on the substrate 7 in the same manner as in the above-described processes.

The resulting surface treatment layers were each coated with a solution of 1% metal-free tetrabicycloporphyrin, expressed by formula (7), in chloroform by spin coating. The resulting metal-free tetrabicycloporphyrin thin coating was baked at 220° C. for 5 minutes on a hot plate, thus forming a 70 nm thick organic semiconductor layer 11 of metal-free tetrabenzoporphyrin expressed by formula (8).

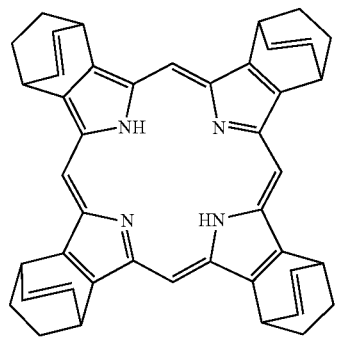

(7)

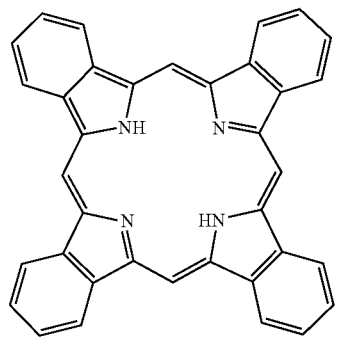

(8)

Figure 3:
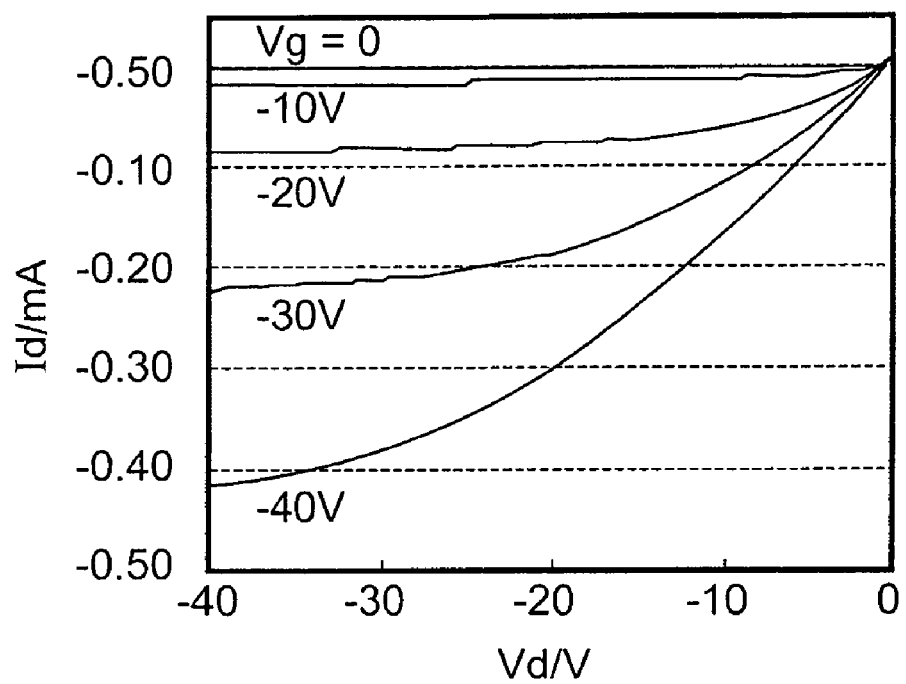
FIG. 3 is a plot of electrical characteristics of the field-effect transistor used in Example 5 of the present invention.

The source electrode 12 and the drain electrode 13 were formed on the organic semiconductor layer 11 with a metal deposition mask by vacuum vapor deposition. The electrodes were formed of gold. The ultimate vacuum in the vacuum deposition was 3×10⁻⁵ Pa and the temperature of the board was set at room temperature. The distance between the source electrode and the drain electrode (channel length L) was 50 μm; the lengths of the source and drain electrodes (channel width W) were 30 mm; the thickness of the gold deposition film was 100 nm. The resulting board, or a transistor, was measured for the Vd-Id and Vg-Id curves with a parameter analyzer 4156C (product name) manufactured by Agilent. FIG. 3 shows the Vg-Id curves of the transistor of Example 5.

The mobility μ (cm²/Vs) was calculated from Equation 2:

$$Id=\mu(CiW/2L)(Vg-Vth)^2 \qquad \text{Equation 2}$$

In the equation, Ci represents the capacitance per unit area (F/cm²) of the gate insulating layer; W and L represent the channel width (mm) and the channel length (μm), respectively; Id, Vg, and Vth represent drain current (A), gate voltage (V), and threshold voltage (V), respectively. The on/off ratio was defined as (maximum |Id|)/(minimum |Id|) when Vg was swept from −40 to 40 V with Vd fixed at −40 V. Table 2 shows the characteristics of metal-free tetrabenzoporphyrin TFTs of Examples 20 to 36 and Comparative Examples 6 to 9.

Examples 37 to 52, Comparative Examples 10 to 13

Evaluation of TFT (FET) Characteristics

TFT 2 (Tetrabenzoporphyrin copper complex TFT)

Transistors was produced in the same manner as the metal-free porphyrin TFT, TFT 1, except that each board of Examples 2 to 19 and Comparative Examples 2 to 5, including the substrate and the insulating layer, was coated with a thin film of tetrabicycleporphyrin copper complex expressed by formula (9) in the same manner as in Examples 20 to 36, and that the tetrabicycleporphyrin copper complex coating was baked at 220° C. for 5 minutes on a hot plate to form an organic semiconductor layer 11 of tetrabenzoporphyrin copper complex expressed by formula (10).

Table 2 shows the characteristics of tetrabenzoporphyrin copper complex TFTs of Examples 37 to 52 and Comparative Examples 10 to 13.

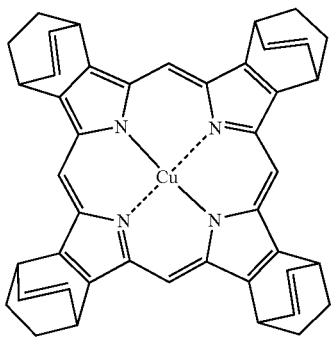

(9)

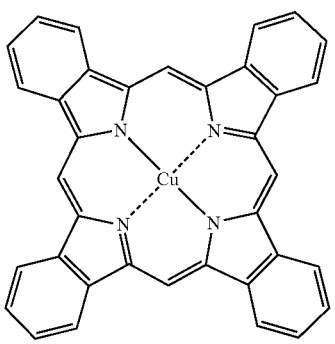

(10)

TABLE 2

| Insulating layer on substrate | | Metal-free benzoporphyrin | | | Benzoporphyrin copper complex | |
|---|---|---|---|---|---|---|
| | | μ (cm²/vs) | on/off ratio | | μ (cm²/vs) | on/off ratio |
| Layer of Example 1 | Example 20 | 0.03 | 14,000 | — | — | — |
| Layer of Example 2 | Example 21 | 0.09 | 30,000 | Example 37 | 0.7 | 11,000 |
| Layer of Example 3 | Example 22 | 0.04 | 22,000 | Example 38 | 0.35 | 5,000 |
| Layer of Example 5 | Example 23 | 0.2 | 40,000 | Example 39 | 1.0 | 14,000 |
| Layer of Example 7 | Example 24 | 0.05 | 17,000 | Example 40 | 0.4 | 11,000 |
| Layer of Example 8 | Example 25 | 0.05 | 18,000 | Example 41 | 0.35 | 8,500 |
| Layer of Example 9 | Example 26 | 0.06 | 18,000 | Example 42 | 0.4 | 9,000 |
| Layer of Example 10 | Example 27 | 0.35 | 55,000 | Example 43 | 1.4 | 24,000 |
| Layer of Example 11 | Example 28 | 0.15 | 34,000 | Example 44 | 1.2 | 18,500 |
| Layer of Example 12 | Example 29 | 0.08 | 23,000 | Example 45 | 0.7 | 10,500 |
| Layer of Example 13 | Example 30 | 0.2 | 35,000 | Example 46 | 1.1 | 22,000 |
| Layer of Example 14 | Example 31 | 0.07 | 20,000 | Example 47 | 0.5 | 12,000 |
| Layer of Example 15 | Example 32 | 0.07 | 18,000 | Example 48 | 0.7 | 17,500 |
| Layer of Example 16 | Example 33 | 0.08 | 21,000 | Example 49 | 0.5 | 10,000 |
| Layer of Example 17 | Example 34 | 0.07 | 19,000 | Example 50 | 0.5 | 9,000 |
| Layer of Example 18 | Example 35 | 0.15 | 33,000 | Example 51 | 1.0 | 23,000 |
| Layer of Example 19 | Example 36 | 0.25 | 42,000 | Example 52 | 1.2 | 22,5000 |
| Layer of Comparative Example 2 | Comparative Example 6 | $8.4 \times 10^{-7}$ | 1 | Comparative Example 10 | $2.2 \times 10^{-6}$ | 1 |
| Layer of Comparative Example 3 | Comparative Example 7 | $1.2 \times 10^{-6}$ | 1 | Comparative Example 11 | $4.2 \times 10^{-6}$ | 1 |
| Layer of Comparative Example 4 | Comparative Example 8 | $5.6 \times 10^{-3}$ | 35 | Comparative Example 12 | $8.7 \times 10^{-2}$ | 15 |
| Layer of Comparative Example 5 | Comparative Example 9 | $3.1 \times 10^{-5}$ | 5 | Comparative Example 13 | $1.0 \times 10^{-5}$ | 1 |

Preparation of organic resin solution 13 to 16 In 87 g of 2-methoxy-1-acetoxypropane, 13 g in total of phenol novolak resin (PN, number average molecular weight: 770, molecular weight distribution: 1.5, sodium content: 0.1 ppm or less) as the resin and crosslinking agent containing a melamine compound having an NH group and a methylol group (Nikalac MX-750LM, produced by Sanwa Chemical, sodium content: 0.2 ppm or less) were completely dissolved at room temperature. Then, the solutions were filtered through a 0.2 μm PTFE membrane filter to obtain organic resin solutions 13 to 16. Relative to 100 parts by weight in total of PN and Nikalac MX-750LM in each of the solutions, 20, 30, 40, and 50 parts by weight of the Nikalac MX-750LM were added, respectively.

Preparation of Organic Resin Solution 17

In 85 g of 1:1 mixed solvent of 1-butanol and ethanol, 15 g of crosslinking agent containing a melamine compound having an NH group and a methylol group (Nikalac MX-750LM, produced by Sanwa Chemical, sodium content: 0.2 ppm or less) was completely dissolved at room temperature. Then, the solutions were filtered through a 0.2 μm PTFE membrane filter to obtain organic resin solution 17.

Insulating Layer Formation

Resin substrates 3 with silver electrode were each coated with any one of organic resin solutions 13 to 17 by dipping, followed by heating at 180° C. for 1 hour in a hot air circulation oven to form a cured organic resin layer (insulating layer). The thicknesses of the thermally cured resin layers were approximately 400 nm.

Evaluation of Solvent Resistance

The thermally cured resin layers (insulating layers) formed from organic solutions 9 to 17 were immersed in room-temperature dimethylformamide (DMF) for 5 minutes. The difference between the thicknesses of the thermally cured resin layer (insulating layer) formed from organic resin solution 17 before and after DMF immersion was over 10%.

Surface Treatment Layer Formation

A 5 nm thick surface treatment layer 10 of 3:1 mixed resin of methylsilsesquioxane ladder polymer (Glass Resin GR-650, produced by Showa Denko) and methyltrimethoxysilane was formed on the surface of each thermally cured resin layer (insulating layer).

A water contact angle of the resulting surface treatment layer was measured with an automatic dynamic contact angle meter DCA-WZ (made by Kyowa Interface Science Co., LTD.).

TFT 3 (Tetrabenzoporphyrin Copper Complex TFT)

The resulting surface treatment layers were each coated with a solution of 1% tetrabicycloporphyrin copper complex in chloroform by spin coating. The resulting tetrabicycloporphyrin copper complex thin coating was baked at 210° C. for 15 minutes on a hot plate, thus forming a 100 nm thick organic semiconductor layer 11 of tetrabenzoporphyrin copper complex.

Figure 4:
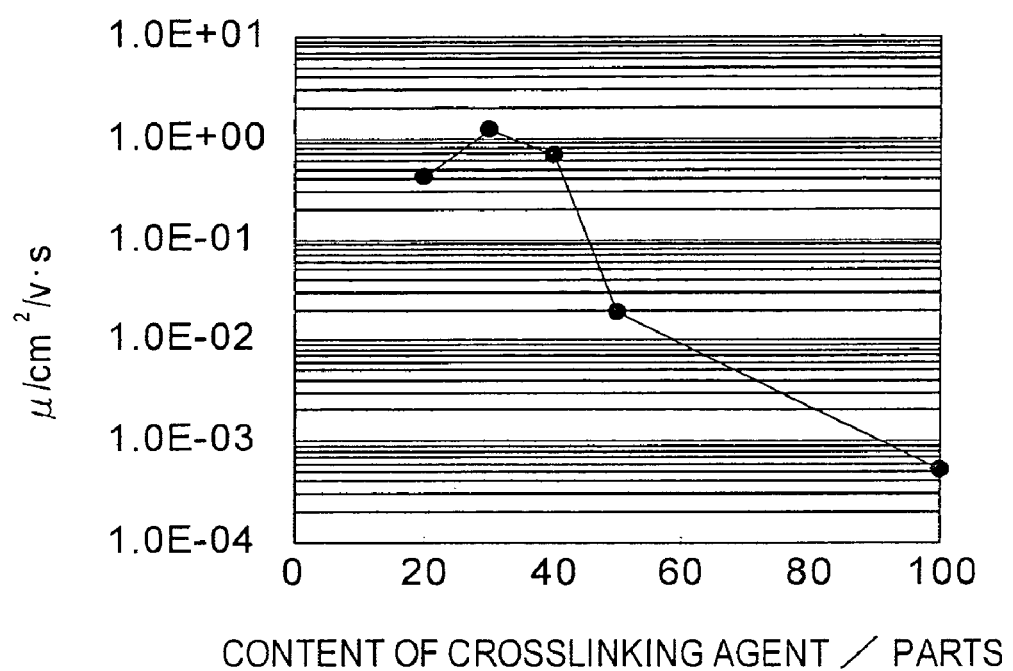
FIG. 4 is a plot of electrical characteristics of the field-effect transistor used in Example 53 to 55 and comparative example 14 and 15 of the present invention.

The source electrode 12 and the drain electrode 13 were formed on the organic semiconductor layer 11 with a metal deposition mask by vacuum vapor deposition. The electrodes were formed of gold. The resulting board, or a transistor, was measured in the same manner as in Example 20 to 52. Table 3 and FIG. 4 show the characteristics of tetrabenzoporphyrin copper complex TFTs of Examples 53 to 55 and Comparative Examples 14 to 15.

Relative to 100 parts by weight in total of the resin and the crosslinking agent, 50 parts or more by weight of the crosslinking agent caused degradations of the TFT characteristics. In contrast, 20 to 40 parts by weight of the crosslinking agent provided TFTs with high mobility and high On/Off ratio.

TABLE 3

| | Organic resin solution | Parts in composition | | Water contact angle of the surface treatment layer (degree) | Solvent resistance | Benzoporphyrin copper complex | |
|---|---|---|---|---|---|---|---|
| | | Resin | Crosslinking agent | | | μ (cm²/vs) | on/off ratio |
| Example 53 | Solution 13 | 80 | 20 | 83.3 | Good | 0.43 | 1,000 |
| Example 54 | Solution 14 | 70 | 30 | 83.6 | Good | 1.24 | 3,000 |
| Example 55 | Solution 15 | 60 | 40 | 83.7 | Good | 0.68 | 1,000 |
| Comparative Example 14 | Solution 16 | 50 | 50 | 81.8 | Good | 0.019 | 11 |
| Comparative Example 15 | Solution 17 | 0 | 100 | 86.0 | Poor | $5.1 \times 10^{-4}$ | 3 |

In the embodiments above, a curable resin composition containing no catalyst or a small amount of acid catalyst is used for the insulating layer. The curable rein composition can provide a uniform and smooth thin insulating layer having a high solvent resistance and high insulation properties on the gate electrode. Consequently, the resulting field-effect transistor can reduce the decreases of the on/off ratio and the mobility, which is due to the migration of low-molecular-weight components from the insulating layer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-088938 filed Mar. 25, 2005, which is hereby incorporated by reference herein in its entirety.

What is claimed is:

1. An organic semiconductor device comprising:
   an organic semiconductor layer; and
   an insulating layer made of a cured material formed from a composition containing a resin and a crosslinking agent, wherein the resin contains an organic resin having a hydroxyl group, and the crosslinking agent contains a compound having at least two crosslinking groups at least one of which is a methylol group or a NH group, and wherein the composition contains the crosslinking agent in the range of 15 to 45 parts by weight relative to 100 parts by weight in total of the resin and the crosslinking agent.

2. The organic semiconductor device according to claim 1, wherein the crosslinking agent contains at least one compound selected from among the compounds expressed by the following general formulas:

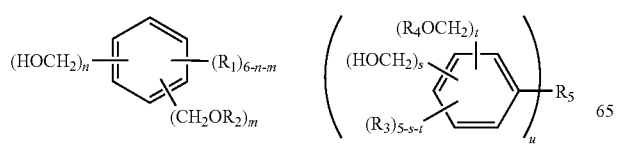

-continued

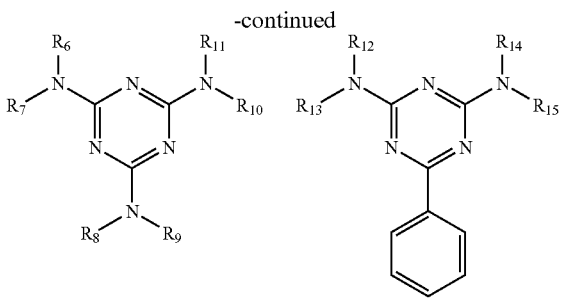

wherein $R_1$ and $R_3$ each represent at least one selected from the group consisting of hydrogen, halogen, hydroxyl, thiol, amino, nitro, cyano, carboxyl, amido, and aryl, and alkyl, alkenyl, alkynyl, alkoxyl, alkylthio, hydroxyalkyl and acyl having carbon numbers in the range of 1 to 12; $R_2$ and $R_4$ each represent at least one selected from the group consisting of alkoxymethyl and acyloxymethyl having carbon numbers in the range of 1 to 6; $R_5$ represents an u-valent organic group and u represents an integer in the range of 1 to 5; n represents an integer in the range of 1 to 6, m represents an integer in the range of 0 to 5, and $2 \leq n+m \leq 6$ holes; s represents an integer in the range of 1 to 5, t represents an integer in the range of 0 to 4, and $2 \leq s+t \leq 5$ holes; the $R_3$'s may be the same or different and the $R_4$'s may be the same or different; $R_6$, $R_7$, $R_8$, $R_9$, $R_{10}$, and $R_{11}$ each represent at least one selected from the group consisting of —CH$_2$OH, —H, and —CH$_2$OR$_{16}$, and alkyl, alkenyl, alkynyl, alkoxyl, alkylthio, hydroxyalkyl and acyl having carbon numbers in the range of 1 to 12, at least one of the $R_6$, $R_7$, $R_8$, $R_9$, $R_{10}$, and $R_{11}$ is —CH$_2$OH or —H, and at least two of the $R_6$, $R_7$, $R_8$, $R_9$, $R_{10}$, and $R_{11}$ are —CH$_2$OH, —H, or —CH$_2$OR$_{16}$; $R_{12}$, $R_{13}$, $R_{14}$, and $R_{15}$ each represent at least one selected from the group consisting of —CH$_2$OH, —H, and —CH$_2$OR$_{18}$, and alkyl, alkenyl, alkynyl, alkoxyl, alkylthio, hydroxyalkyl and acyl having carbon numbers in the range of 1 to 12, at least one of the $R_{12}$, $R_{13}$, $R_{14}$, and $R_{15}$ is —CH$_2$OH or —H, and at least two of the $R_{12}$, $R_{13}$, $R_{14}$, and $R_{15}$ are —CH$_2$OH, —H, or —CH$_2$OR$_{18}$; and $R_{16}$ and $R_{18}$ each represent at least one selected from the group consisting of alkoxymethyl and acyloxymethyl having carbon numbers in the range of 1 to 6, the $R_{16}$'s may be the same or different and the $R_{18}$'s may be the same or different.

3. The organic semiconductor device according to claim 1, wherein the hydroxyl group of the organic resin is a phenolic hydroxyl group.

4. The organic semiconductor device according to claim 3, wherein the organic resin having the phenolic hydroxyl group is a polyvinylphenol resin and/or a phenol resin.

5. The organic semiconductor device according to claim 1, wherein the insulating layer has a volume resistivity of about $1 \times 10^{13}$ Ω·cm or more.

6. The organic semiconductor device according to claim 1, further comprising a substrate containing a resin.

7. field-effect transistor comprising:
   an organic semiconductor layer;
   an insulating layer made of a cured material formed from a composition containing a resin and a crosslinking agent,
   wherein the resin contains an organic resin having a hydroxyl group, and the crosslinking agent contain a compound having at least two crosslinking groups at least one of which is a methylol group or a NH group,
   and wherein said composition contains said crosslinking agent in the range of 15 to 45 parts by weight relative to 100 parts by weight in total of the resin and the crosslinking agent.

8. The field-effect transistor according to claim 7, wherein the insulating layer is a gate insulating layer.

9. The field-effect transistor according to claim 7, wherein the crosslinking agent contains at least one compound selected from among the compounds expressed by the following general formulas:

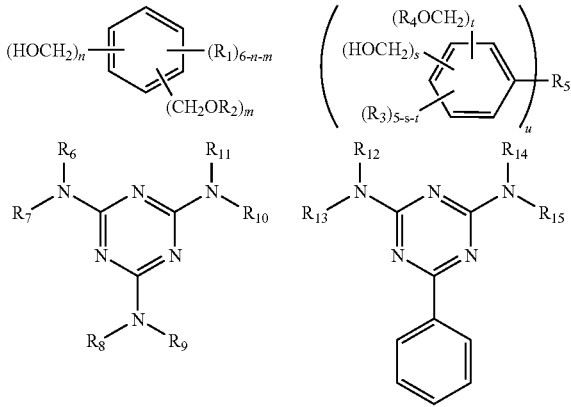

wherein $R_1$ and $R_3$ each represent at least one selected from the group consisting of hydrogen, halogen, hydroxyl, thiol, amino, nitro, cyano, carboxyl, amido, and aryl, and alkyl, alkenyl, alkynyl, alkoxyl, alkylthio, hydroxyalkyl and acyl having carbon numbers in the range of 1 to 12; $R_2$ and $R_4$ each represent at least one selected from the group consisting of alkoxymethyl and acyloxymethyl having carbon numbers in the range of 1 to 6; $R_5$ represents an u-valent organic group and u represents an integer in the range of 1 to 5; n represents an integer in the range of 1 to 6, m represents an integer in the range of 0 to 5, and $2 \leq n+m \leq 6$ holes; s represents an integer in the range of 1 to 5, t represents an integer in the range of 0 to 4, and $2 \leq s+t \leq 5$ holes; the $R_3$'s may be the same or different and the $R_4$'s may be the same or different; $R_6$, $R_7$, $R_8$, $R_9$, $R_{10}$, and $R_{11}$ each represent at least one selected from the group consisting of —$CH_2OH$, —H, and —$CH_2OR_{16}$, and alkyl, alkenyl, alkynyl, alkoxyl, alkylthio, hydroxyalkyl and acyl having carbon numbers in the range of 1to 12, at least one of the $R_6$, $R_7$, $R_8$, $R_9$, $R_{10}$, and $R_{11}$ is —$CH_2OH$ or —H, and at least two of the $R_6$, $R_7$, $R_8$, $R_9$, $R_{10}$, and $R_{11}$ are —$CH_2OH$, —H, or —$CH_2OR_{16}$; $R_{12}$, $R_{13}$, $R_{14}$, and $R_{15}$ each represent at least one selected from the group consisting of —$CH_2OH$, —H, and —$CH_2OR_{18}$, and alkyl, alkenyl, alkynyl, alkoxyl, alkylthio, hydroxyalkyl and acyl having carbon numbers in the range of 1 to 12, at least one of the $R_{12}$, $R_{13}$, $R_{14}$, and $R_{15}$ is —$CH_2OH$ or —H, and at least two of the $R_{12}$, $R_{13}$, $R_{14}$, and $R_{15}$ are —$CH_2OH$, —H, or —$CH_2OR_{18}$; and $R_{16}$ and $R_{18}$ each represent at least one selected from the group consisting of alkoxymethyl and acyloxymethyl having carbon numbers in the range of 1 to 6, the $R_{16}$'s may be the same or different and the $R_{18}$'s may be the same or different.

10. The field-effect transistor according to claim 7, wherein the hydroxyl group of the organic resin is a phenolic hydroxyl group.

11. The field-effect transistor according to claim 10, the organic resin having the phenolic hydroxyl group is a polyvinylphenol resin and/or a phenol resin.

12. The field-effect transistor according to claim 7, wherein the insulating layer has a volume resistivity of about $1 \times 10^{13}$ Ω·cm or more.

13. The field-effect transistor according to claim 7, wherein the organic semiconductor layer contains a porphyrin compound.

14. The field-effect transistor according to claim 7, further comprising a substrate containing a resin.

\* \* \* \* \*